(12) United States Patent
Akita et al.

(10) Patent No.: US 9,300,461 B2
(45) Date of Patent: Mar. 29, 2016

(54) RECEPTION CIRCUIT

(71) Applicant: DENSO CORPORATION, Kariya, Aichi-pref. (JP)

(72) Inventors: Hironobu Akita, Okazaki (JP); Shigeki Ohtsuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/420,721

(22) PCT Filed: Sep. 12, 2013

(86) PCT No.: PCT/JP2013/005413
§ 371 (c)(1),
(2) Date: Feb. 10, 2015

(87) PCT Pub. No.: WO2014/045551
PCT Pub. Date: Mar. 27, 2014

(65) Prior Publication Data
US 2015/0222418 A1    Aug. 6, 2015

(30) Foreign Application Priority Data

Sep. 18, 2012    (JP) ................................. 2012-204360

(51) Int. Cl.
*H03D 3/24* (2006.01)
*H04L 7/00* (2006.01)
*H03L 7/087* (2006.01)
*H03L 7/22* (2006.01)
(Continued)

(52) U.S. Cl.
CPC .............. *H04L 7/0087* (2013.01); *H03L 7/085* (2013.01); *H03L 7/087* (2013.01); *H03L 7/22* (2013.01); *H04L 7/0331* (2013.01); *H04L 7/0337* (2013.01)

(58) Field of Classification Search
CPC ..... H04L 7/0337; H04L 7/0334; H04L 7/033; H04L 7/0029; H03L 7/091; H03L 7/0896; H03L 7/087; H03L 7/0891; H03L 7/095; H03L 7/0814
USPC .................................................. 375/354–376
See application file for complete search history.

(56) References Cited

U.S. PATENT DOCUMENTS

| 5,557,648 A | 9/1996 | Ishihara |
| 5,726,818 A | 3/1998 | Reed et al. |
| 6,657,466 B1 * | 12/2003 | Sudjian ......................... 327/158 |

(Continued)

FOREIGN PATENT DOCUMENTS

| EP | 1 898 582 A1 | 3/2008 |
| JP | 2010-183314 A | 8/2010 |
| JP | 2011-155566 A | 8/2011 |

OTHER PUBLICATIONS

Office Action mailed Apr. 14, 2015 issued in corresponding JP patent application No. 2012-204360 (and English translation).

(Continued)

*Primary Examiner* — James M Perez
(74) *Attorney, Agent, or Firm* — Posz Law Group, PLC

(57) ABSTRACT

In a reception circuit, in a first operating mode, the operation of at least a first charge pump circuit of a phase frequency comparator, the first charge pump circuit, samplers other than a specific sampler in samplers provided in a multi-phase sampler, and a data reproducing unit stops. In a second operating mode, the operation of at least a second charge pump circuit of a phase comparator and the second charge pump circuit stops.

12 Claims, 16 Drawing Sheets

(51) Int. Cl.
*H04L 7/033* (2006.01)
*H03L 7/085* (2006.01)

(56) References Cited

U.S. PATENT DOCUMENTS

| | | | |
|---|---|---|---|
| 6,771,202 B2* | 8/2004 | Watanabe et al. | 341/155 |
| 6,774,689 B1* | 8/2004 | Sudjian | 327/158 |
| 2004/0062336 A1 | 4/2004 | Kuwata et al. | |
| 2006/0227916 A1 | 10/2006 | Masui et al. | |
| 2006/0256909 A1 | 11/2006 | On et al. | |
| 2007/0126514 A1* | 6/2007 | Lin et al. | 331/16 |
| 2008/0152057 A1 | 6/2008 | Lee et al. | |
| 2010/0052747 A1* | 3/2010 | Sugano et al. | 327/157 |
| 2012/0013374 A1* | 1/2012 | Lin et al. | 327/147 |
| 2012/0033773 A1* | 2/2012 | Nedovic | 375/371 |
| 2012/0068995 A1* | 3/2012 | Ozawa et al. | 345/214 |
| 2012/0139593 A1* | 6/2012 | Saito | 327/156 |
| 2012/0155589 A1* | 6/2012 | den Besten et al. | 375/376 |

OTHER PUBLICATIONS

Vichienchom et al., "A Multi-Gigabit CMOS Data Recovery Circuit Using an Analog Parallel Sampling Technique." Circuits and Systems, 2001, ISCAS 2001, The IEEE International Symposium, vol. 4, pp. 238-241.

International Search Report and Written Opinion mailed Dec. 17, 2013 in the corresponding International application No. PCT/JP2013/005413 (and English translation).

"Architectures for Multi-Gigabit Wire-Linked Clock and Data Recovery" by Ming-ta Hsieh and Gerald E. Sobelman, IEEE Circuit and Systems Magazine, Fourth Quarter, 2008.

* cited by examiner

RECEPTION CIRCUIT

CROSS REFERENCE TO RELATED APPLICATIONS

This disclosure is a U.S. national stage application of International Patent Application No. PCT/JP2013/005413 filed on Sep. 12, 2013 and is based on Japanese Patent Application No. 2012-204360 filed on Sep. 18, 2012, the entire contents of which are incorporated herein by reference.

TECHNICAL FIELD

The present disclosure relates to a reception circuit that reproduces a clock and data from a data signal.

BACKGROUND

In recent years, a clock and data recovery (CDR) technique has been widely used in data transmission between LSIs. In the CDR technique, various circuit systems have been proposed as disclosed in NPL 1. As a classification affecting the practical use, these circuit systems are classified into a system using a feedback loop for frequency locking and phase locking between a received data signal and a clock signal for a reception circuit, and a system using no feedback loop.

In NPL 1, a PLL-based CDR, a DPLL-based CDR, a combination of PLL/DLL based CDR, a phase interpolator based CDR and an injection locked based CDR have a feedback loop. Among those techniques, the PLL based CDR without reference clock, the digital PLL (DPLL) based CDR, and the combination of PLL/DLL based CDR suffer from a problem that a long time is required for locking in order to feedback both of a frequency and a phase for matching. On the other hand, since both of the frequency and the phase are fed back, there are advantages in that accuracy of the clock signal to be reproduced is high, and a problem on a bit error due to a reduction in the clock precision is less likely to occur.

On the other hand, the PLL-based CDR with an external reference clock, the DLL-based CDR, the phase interpolator (PI) based CDR, and the injection locked based CDR receive a reference clock signal F(ref) from an external, and perform feedback only for phase locking. Therefore, as compared with the CDR feeding back both of the frequency and the phase for matching, there is an advantage in that the time required for locking is short. However, since the clock signal for the reception circuit depends on the reference clock signal F(ref), if there is a shift in frequency between the received data signal and the reference clock signal F(ref), a precision in the clock signal is deteriorated, and bit errors due to the deterioration of precision are likely to occur.

In NPL 1, the gated oscillator based CDR has no feedback loop for both of the frequency and the phase, and the time required for locking is short. However, since the gated oscillator based CDR receives the reference clock signal F(ref) from an external, there arises a problem that the precision in the clock signal is deteriorated due to the frequency error. Also, because an averaging process is not or less performed as the locking time of the phase is shorter, the phase errors are likely to occur.

In NPL 1, the oversampling based CDR is classified into a method using the feedback in the detect bit boundary block, and a method using no feedback. The features of the locking time, the clock precision, and the phase error in both of those systems are also identical with those in the other CDR circuits described above.

Each of the plural circuit systems described above has any advantages and any disadvantages and there is no circuit system excellent in all of those features. In practice, a suitable circuit system is selected depending on the applied use. Therefore, in order to use the same LSI for plural applications, there is a need to produce the plural CDR circuits in the LSI, and appropriately switch one of those CDR circuits to another. However, it is difficult to mount the plural CDR circuits on the LSI in practical application because the chip size increases.

NON-PATENT LITERATURE

NPL 1: Ming-ta Hsieh and Gerald E. Sobelman, "Architectures for Multi-Gigabit Wire-Linked Clock and Data Recovery", IEEE CIRCUITS AND SYSTEMS MAGAZINE, FOURTH QUARTER 2008, pp. 45-57

SUMMARY

An object of the present disclosure is to provide a reception circuit capable of switching one of two circuit systems having different characteristics from the other while suppressing an increase in a layout size when mounting the reception circuit on an IC.

According to one aspect of the present disclosure, there is provided a reception circuit including a frequency tracking loop, a multi-phase sampler, a data reproducing unit, a phase comparator, and a second charge pump circuit. The frequency tracking loop includes a voltage controlled oscillator, a phase frequency comparator, a first charge pump circuit, and a loop filter. The voltage controlled oscillator outputs multi-phase clock signals having an oscillation frequency corresponding to the control voltage and shifted by equal phase. The phase frequency comparator compares a phase of a predetermined clock signal of the multi-phase clock signals with a phase of a reference clock signal. The first charge pump circuit outputs a current corresponding to the comparison result of the phase-frequency comparator. The loop filter generates a control voltage applied to the voltage controlled oscillator in response to the current.

The multi-phase sampler has at least one sampler, and samples a transmitted data signal by the multi-phase clock signal. The data reproducing unit temporarily holds the sample data sampled by the multi-phase sampler, and extracts the sample data at a position shifted by a predetermined width from a data boundary position of the data signal. The phase comparator has a sampler, compares the phase of the data signal with the phase of a specific clock signal supplied to the specific sampler with the use of output data of the specific sampler among the samplers provided in the multi-phase sampler and output data of a sampler provided in the phase comparator, and reproduces data from the data signal. The second charge pump circuit outputs a current corresponding to the comparison result of the phase of the phase comparator to the loop filter.

In a first operating mode, the operation of at least the first charge pump circuit of the phase frequency comparator, the first charge pump circuit, the samplers other than the specific sampler provided in the multi-phase sampler, and the data reproducing unit stops. In a second operating mode, the operation of at least the second charge pump circuit of the phase comparator and the second charge pump circuit stops.

In the first operating mode and the second operating mode, the reception circuit can switch between two circuit systems different in characteristics from each other. For that reason, as compared with the case of mounting two circuit systems, independently, an increase in layout size when mounting the reception circuit on the IC can be suppressed.

According to another aspect of the present disclosure, there is provided a reception circuit including a frequency tracking loop, a second voltage controlled oscillator, an edge detector, a selector, a phase comparator, and a second charge pump circuit. The frequency tracking loop includes a first voltage controlled oscillator, a phase frequency comparator, a first charge pump circuit, and a loop filter. The first voltage controlled oscillator outputs a first clock signal having an oscillation frequency corresponding to the control voltage. The phase frequency comparator compares a phase of the first clock signal with a phase of a reference clock signal. The first charge pump circuit outputs a current corresponding to the comparison result of the phase-frequency comparator. The loop filter generates a control voltage applied to the first voltage controlled oscillator in response to the current.

The second voltage controlled oscillator has a gate terminal, performs oscillation operation having an oscillation frequency corresponding to the control voltage output from the loop filter on the condition that a signal having a permission level is input to the gate terminal, and outputs a second clock signal. The edge detector outputs an edge detection signal having the permission level upon detecting an edge of the transmitted data signal. The selector outputs the signal having the permission level to the gate terminal in a first operating mode, and outputs an edge detection signal from the edge detector to the gate terminal in a second operating mode. The phase comparator has a sampler which samples the data signal with the second clock signal, is capable of comparing the phase of the data signal with the phase of the second clock signal, and reproduces data from the data signal. The second charge pump circuit outputs a current corresponding to the comparison result of the phase of the phase comparator to the loop filter.

In the first operating mode, the operation of at least the first charge pump circuit of the phase frequency comparator, the first charge pump circuit, the first voltage controlled oscillator, and the edge detector stops, and in the second operating mode, the operation of the second charge pump circuit stops.

In the first operating mode and the second operating mode, the reception circuit can switch between two circuit systems different in characteristics from each other. For that reason, as compared with the case of mounting two circuit systems, independently, an increase in layout size when mounting the reception circuit on the IC can be suppressed.

According to another aspect of the present disclosure, there is provided a reception circuit including a frequency tracking loop, a multi-phase sampler, a data reproducing unit, a phase comparator, and a selector. The frequency tracking loop includes a voltage controlled oscillator, a phase frequency comparator, a charge pump circuit, and a loop filter. The voltage controlled oscillator outputs multi-phase clock signals having an oscillation frequency corresponding to the control voltage and shifted by equal phase. The phase frequency comparator compares a phase of a predetermined clock signal of the multi-phase clock signals with a phase of a reference clock signal. The charge pump circuit outputs a current corresponding to the comparison result of the phase-frequency comparator. The loop filter generates a control voltage applied to the voltage controlled oscillator in response to the current.

The multi-phase sampler has at least one sampler, and samples a transmitted data signal by the multi-phase clock signal. The data reproducing unit temporarily holds the sample data sampled by the multi-phase sampler, and extracts the sample data at a position shifted by a predetermined width from a data boundary position of the data signal. The phase comparator has a sampler, compares the phase of the data signal with the phase of a specific clock signal supplied to the specific sampler with the use of output data of the specific sampler among the samplers provided in the multi-phase sampler and output data of a sampler provided in the phase comparator, and reproduces data from the data signal. The selector selects the comparison result of the phase comparator and supplies the comparison result to the charge pump circuit in a first operating mode, and selects the comparison result of the phase frequency comparator and supplies the comparison result to the charge pump circuit in a second operating mode. The charge pump circuit always operates. In the first operating mode, the operation of at least one of the phase frequency comparator, the samplers other than the specific sampler provided in the multi-phase sampler, and the data reproducing unit stops. In the second operating mode, the operation of the phase comparator stops.

In the first operating mode and the second operating mode, the reception circuit can switch between two circuit systems different in characteristics from each other. For that reason, as compared with the case of mounting two circuit systems, independently, an increase in layout size when mounting the reception circuit on the IC can be suppressed.

According to another aspect of the present disclosure, there is provided a reception circuit including a frequency tracking loop, a second voltage controlled oscillator, an edge detector, a first selector, a phase comparator, and a second selector. The frequency tracking loop includes a first voltage controlled oscillator, a phase frequency comparator, a charge pump circuit, and a loop filter. The first voltage controlled oscillator outputs a first clock signal having an oscillation frequency corresponding to the control voltage. The phase frequency comparator compares a phase of the first clock signal with a phase of a reference clock signal. The charge pump circuit outputs a current corresponding to the comparison result of the phase frequency comparator. The loop filter generates a control voltage applied to the first voltage controlled oscillator in response to the current.

The second voltage controlled oscillator has a gate terminal, performs oscillation operation having an oscillation frequency corresponding to the control voltage output from the loop filter on the condition that a signal having a permission level is input to the gate terminal, and outputs a second clock signal. The edge detector outputs an edge detection signal having the permission level upon detecting an edge of the transmitted data signal. The first selector outputs the signal having the permission level to the gate terminal in a first operating mode, and outputs an edge detection signal from the edge detector to the gate terminal in a second operating mode. The phase comparator has a sampler which samples the data signal with the second clock signal, is capable of comparing the phase of the data signal with the phase of the second clock signal, and reproduces data from the data signal. The second selector selects the comparison result of the phase comparator and supplies the comparison result to the charge pump circuit in the first operating mode, and selects the comparison result of the phase frequency comparator and supplies the comparison result to the charge pump circuit in the second operating mode.

The charge pump circuit always operates. In the first operating mode, the operation of at least one of the phase frequency comparator, the first voltage controlled oscillator, and the edge detector stops.

In the first operating mode and the second operating mode, the reception circuit can switch between two circuit systems different in characteristics from each other. For that reason, as compared with the case of mounting two circuit systems, independently, an increase in layout size when mounting the reception circuit on the IC can be suppressed.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Hereinafter, in respective embodiments, substantially the same configurations are denoted by identical symbols, and the same description will be omitted.

First Embodiment

Figure 1:
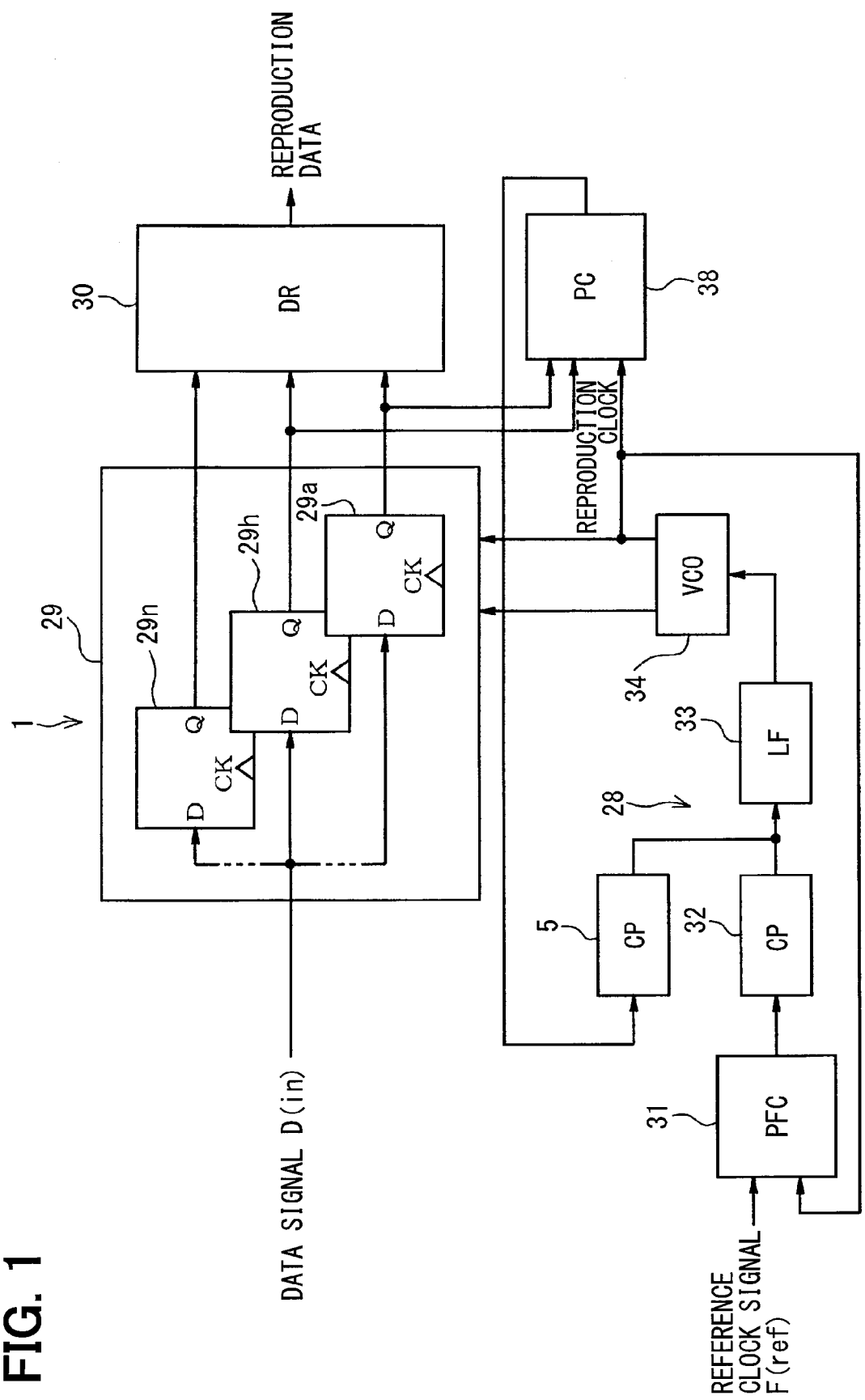
FIG. 1 is a block diagram illustrating a reception circuit according to a first embodiment of the present disclosure.

Hereinafter, a first embodiment will be described with reference to FIGS. 1 to 11. A CDR circuit 1 illustrated in FIG. 1 is a reception circuit that reproduces a clock and data from a data signal D(in) serially transmitted, and is a circuit macro formed on an LSI. The CDR circuit 1 has both of functions of PLL based CDR without reference clock, that is, a CDR circuit 2 of a PLL system illustrated in FIG. 2, and oversampling based on CDR, that is, a CDR circuit 3 of an oversampling system illustrated in FIG. 3, and can switch between both of those systems.

Figure 2:
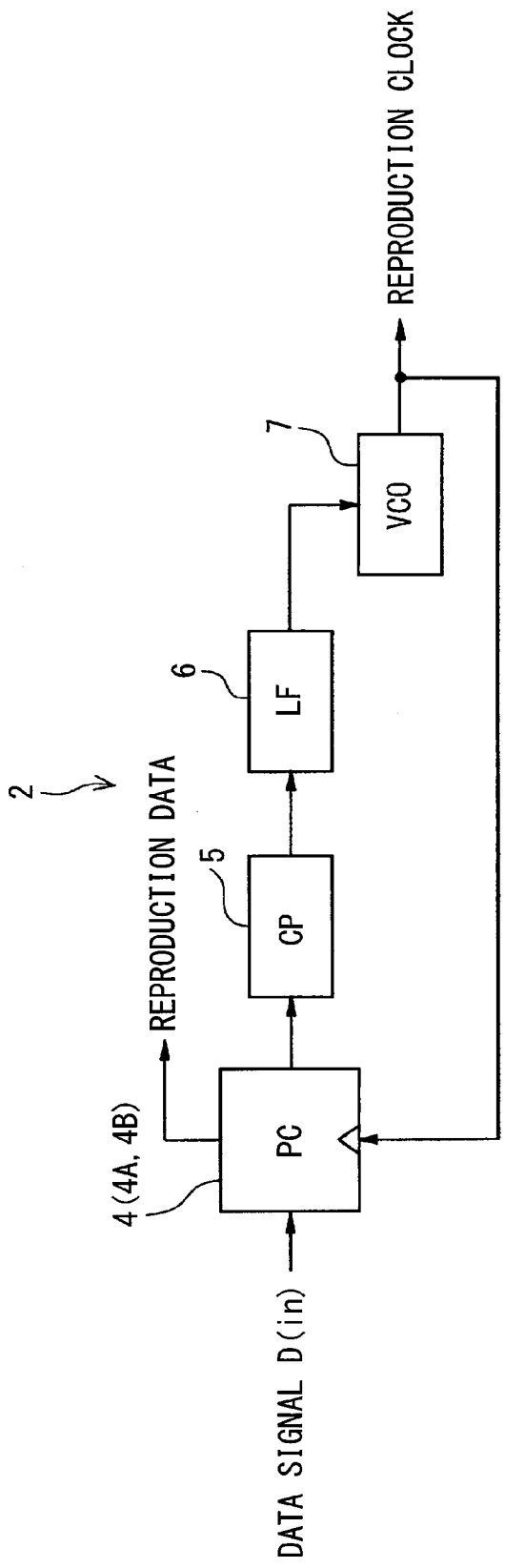
FIG. 2 is a block diagram illustrating a CDR circuit of a PLL system.

The CDR circuit 2 of the PLL system illustrated in FIG. 2 includes a frequency tracking loop (not shown) and a phase tracking loop, and reproduces the clock and data without using a reference clock signal F(ref). The phase tracking loop includes a phase comparator 4 (PC), a charge pump circuit 5 (CP), a loop filter 6 (LF), and a voltage controlled oscillator 7 (VCO). The phase comparator 4 compares the phase of a data signal D(in) output from an external with the phase of a reproduction clock signal, and outputs an up signal or a down signal to the charge pump circuit 5 according to the comparison result.

Figure 4:
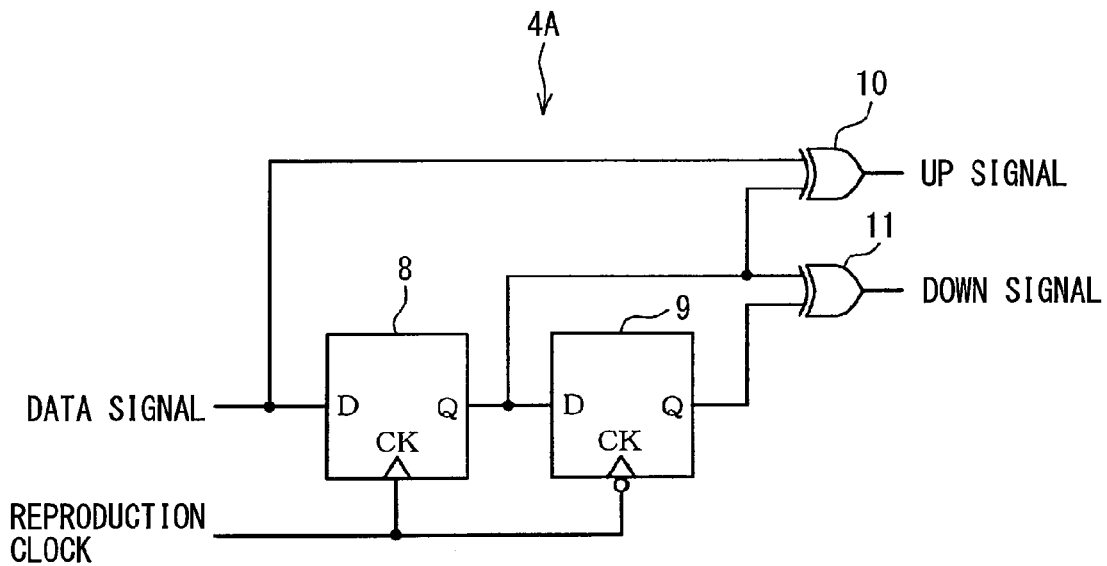
FIG. 4 is a circuit diagram illustrating a phase comparator of Hogge.
Figure 5:
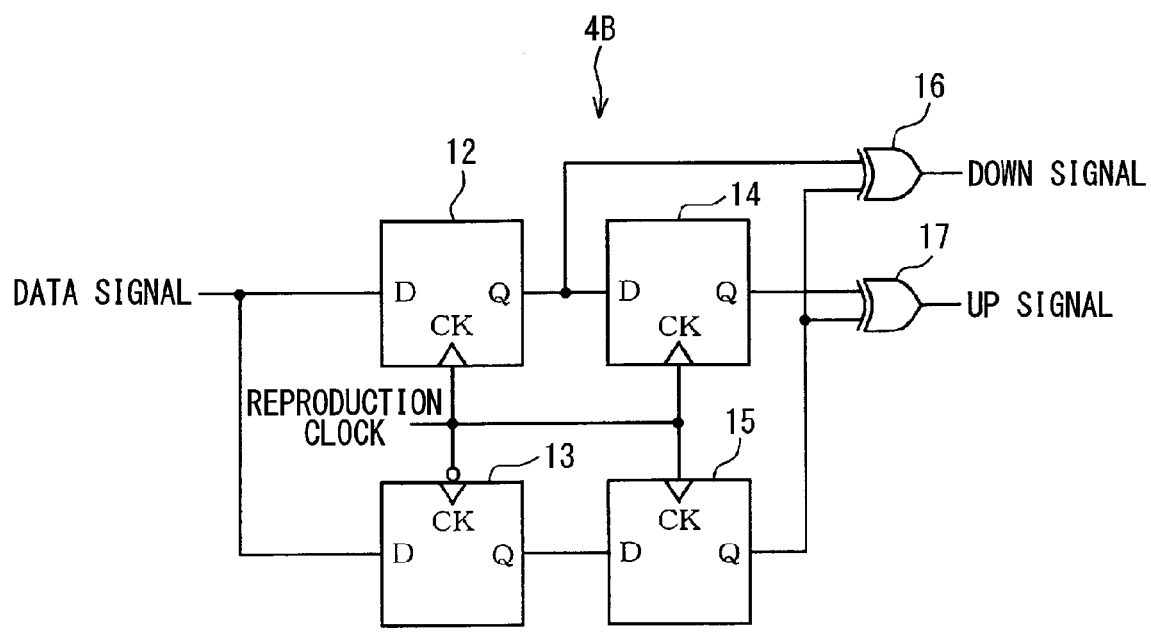
FIG. 5 is a circuit diagram illustrating a phase comparator of Alexander.

FIGS. 4 and 5 illustrate specific configurations of the phase comparator 4. A phase comparator 4A of Hogge illustrated in FIG. 4 includes D-type flip-flops 8 and 9 (DFF) corresponding to first and second samplers, and exclusive OR gates 10 and 11 (ExOR) corresponding to first and second logic circuits. The DFF 8 samples data at a bit center position according to a reproduction clock signal. The DFF 9 samples data at a bit end position thereof according to an inversion signal having a phase difference of 180 degrees with respect to the reproduction clock signal.

The ExOR 10 outputs the up signal of H level as a command signal for advancing the phase of the reproduction clock signal when the data signal is logically inconsistent with an output signal of the DFF 8. The ExOR 11 outputs the down signal of H level as a command signal for delaying the phase of the reproduction clock signal when the output signal of the DFF 8 is logically inconsistent with an output signal of the DFF 9. That is, the up signal is at the H level in a period from the transition of the data to the output transition of the DFF 8 by the rise of the reproduction clock signal. The down signal is at the H level in a period (½ period of the reproduction clock signal) from the output transition of the DFF 8 to the output transition of the DFF 9 by a falling edge of the reproduction clock signal.

A phase comparator 4B of Alexander illustrated in FIG. 5 includes DFFs 12 to 15 corresponding to first to fourth samplers, and ExORs 16 and 17 corresponding to first and second logic circuits. The DFF 12 samples data at a bit center position according to a reproduction clock signal. The DFF 13 samples data at an end position thereof according to an inversion signal having a phase difference of 180 degrees with respect to the reproduction clock signal. The DFF 14 samples the output signal of the DFF 12 by the reproduction clock signal, and outputs an output signal of the DFF 12 while being delayed by one period of the clock. The DFF 15 samples the output signal of the DFF 13 by the reproduction clock signal, and outputs an output signal of the DFF 13 while being delayed by ½ period of the clock.

The ExOR 16 outputs the down signal of H level as a command signal for delaying the phase of the reproduction clock signal when the output signal of the DFF 12 is logically inconsistent with an output signal of the DFF 15. The ExOR 17 outputs the up signal of H level as a command signal for advancing the phase of the reproduction clock signal when the output signal of the DFF 14 is logically inconsistent with an output signal of the DFF 15. That is, the down signal becomes H level when data sampled at the bit end position is different from data sampled at a bit center position after ½ cycles from the bit end position. The up signal becomes H level when data sampled at the bit end position is different from data sampled at a bit center position before ½ cycles from the bit end position.

Figure 6:
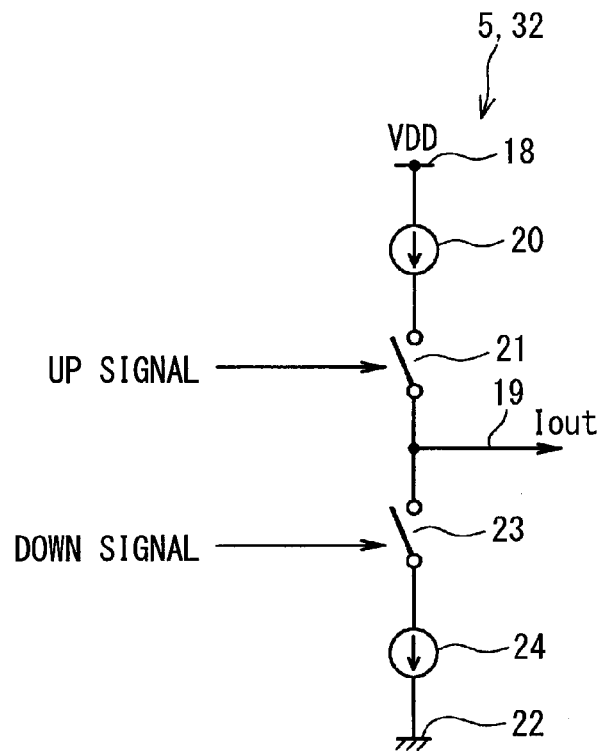
FIG. 6 is a circuit diagram illustrating a charge pump circuit.
Figure 7:
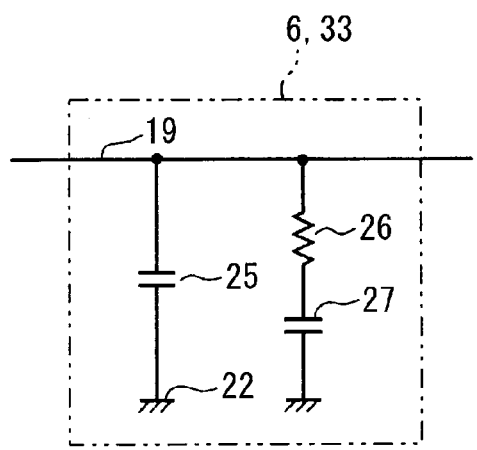
FIG. 7 is a circuit diagram illustrating a loop filter.

The phase comparator 4 (4A, 4B) controls an output current of the charge pump circuit 5 by the up signal and the down signal. FIG. 6 illustrates a specific configuration of the charge pump circuit 5. A constant current circuit 20 and a semiconductor switch 21 are connected in series with each other between a power supply line 18 and an output line 19, and a semiconductor switch 23 and a constant current circuit 24 are connected in series with each other between the output line 19 and a ground 22. The charge pump circuit 5 turns on the semiconductor switch 21 and outputs a source current when receiving the up signal, and turns on the semiconductor switch 23 and outputs a sink current when receiving the down signal.

The loop filter 6 includes a capacitor 25, and a series circuit including a resistor 26 and a capacitor 27 which are disposed between the output line 19 of the charge pump circuit 5 and the ground 22. The loop filter 6 converts a current output from the charge pump circuit 5 into a control voltage. The voltage controlled oscillator 7 includes, for example, a closed loop configuration in which plural inverters having the control voltage as a supply voltage are cascade-connected, and reproduces and outputs a clock signal having an oscillation frequency corresponding to the control voltage.

Although omitted in FIG. 2, the frequency tracking loop of the CDR circuit 2 includes a frequency comparator (FD), a charge pump circuit (CP), a loop filter (LF), and the voltage controlled oscillator 7 (VCO) described above. The frequency comparator compares a frequency of the data signal D(in) input from the external with a frequency of the reproduction clock signal. The frequency tracking loop generates the control voltage of the voltage controlled oscillator 7 when the CDR circuit 2 starts, or in a period when the phase lock is lost. When a difference in the frequency falls within a capture range of the phase tracking loop, the phase tracking loop takes over the generation of the control voltage of the voltage controlled oscillator 7.

Figure 3:
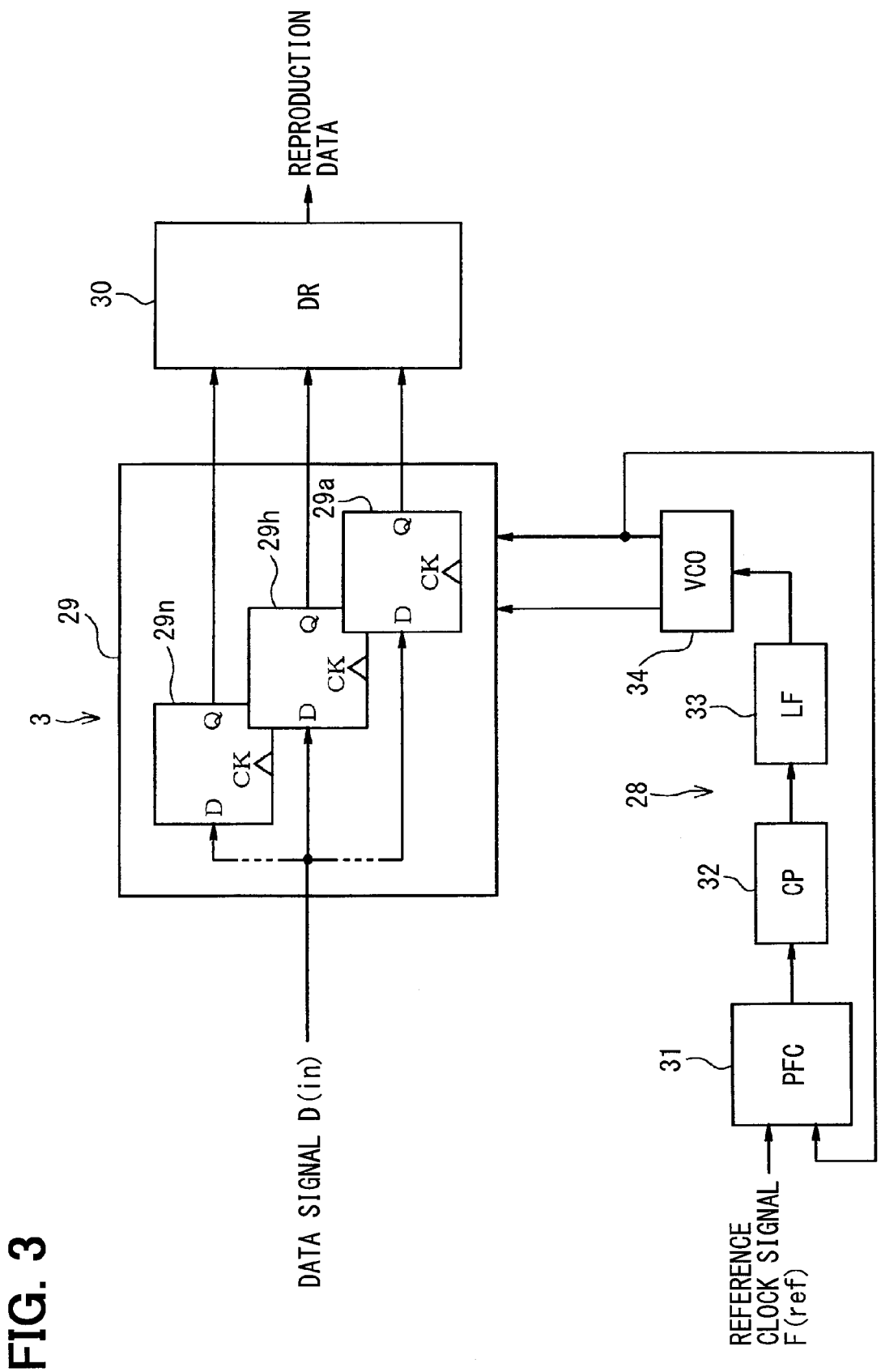
FIG. 3 is a block diagram illustrating a CDR circuit of an oversampling system.

The CDR circuit 3 of the oversampling system illustrated in FIG. 3 includes a frequency tracking loop 28, a multi-phase sampler 29, and a data reproducing unit 30 (DR). The frequency tracking loop 28 includes a phase frequency comparator 31 (PFC), a charge pump circuit 32 (CP), a loop filter 33 (LF), and a voltage controlled oscillator 34 (VCO).

Figure 8:
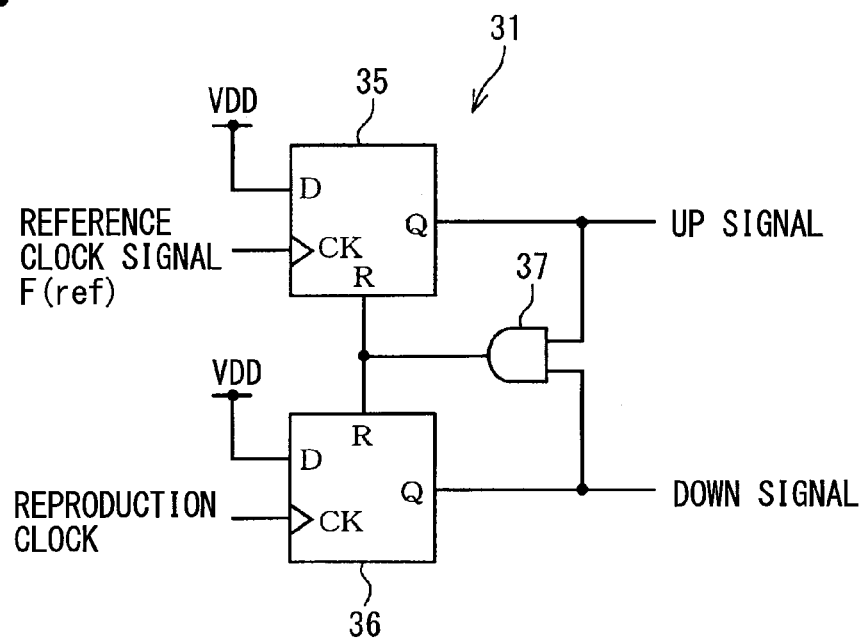
FIG. 8 is a circuit diagram illustrating a phase frequency comparator.

As illustrated in FIG. 8, the phase frequency comparator 31 includes a pair of DFFs 35 and 36, and an AND gate 37. The AND gate 37 outputs a reset signal to the DFFs 35 and 36. The DFF 35 receives the reference clock signal F(ref) from the external, and the DFF 36 receives one of the reproduced multi-phase clock signals, and outputs the up signal and the down signal according to a phase difference between leading edges of those signals.

The charge pump circuit 32 and the loop filter 33 have the same circuit configurations as those of the charge pump circuit 5 and the loop filter 6, respectively. However, the circuit constants are not necessarily the same. The voltage controlled oscillator 34 is configured by, for example, a ring oscillator in which an odd number of inverters having the control voltage as the supply voltage are cascade-connected. The multi-phase clock signals having an oscillation frequency corresponding to the control voltage and shifted by an equal phase are output from an output terminal of the inverter at each stage.

The multiphase sampler 29 has DFFs 29a to 29n of the same number as the number of phases of the multi-phase clock signals, and samples the data signals D(in) with the multi-phase clock signals. The data reproducing unit 30 includes a data register, a bit boundary detector, and a data selector. The data register is a FIFO buffer that temporarily holds the sample data from the multi-phase sampler 29. The bit boundary detector detects a boundary position of bit data where the data transition of the sample data occurs. The data selector reads sample data at a position shifted from the boundary position by ½ of a data width from a data register as reproduction data.

The CDR circuit 1 illustrated in FIG. 1 has the functions of the CDR circuits 2 and 3 illustrated in FIGS. 2 and 3. The CDR circuit 1 is not configured to juxtapose the CDR circuits 2 and 3 to each other as it is, but has a configuration in which a circuit portion common to both of those circuits is shared. Specifically, the voltage controlled oscillator 34, the loop filter 33, and the DFF 29a (DFFs 29a and 29h when the phase comparator 4B illustrated in FIG. 5 is used) are shared.

The CDR circuit 1 includes the frequency tracking loop 28, the multi-phase sampler 29, the data reproducing unit 30, the phase comparator 38 (PC), and the charge pump circuit 5. Also, although omitted from the drawing, the CDR circuit 1 has a frequency tracking loop for operating as the CDR circuit of the PLL system. The charge pump circuits 32 and 5 correspond to first and second charge pump circuits, respectively.

The phase comparator 38 compares a phase of a first clock signal (specific clock signal) that is an arbitrary one of the multi-phase clock signals with the phase of the data signal, and outputs the up signal or the down signal. When the circuit of Hogge is used, the phase comparator 38 has a configuration excluding the DFF 8 from the phase comparator 4A illustrated in FIG. 4. Instead of the excluded DFF 8, the DFF 29a having the first clock signal as the sampling clock is used in the multi-phase sampler 29.

When the circuit of Alexander is used, the phase comparator 38 has a configuration excluding the DFFs 12 and 13 from the phase comparator 4B illustrated in FIG. 5. Instead of the excluded DFF 12, the DFF 29a having the first clock signal as the sampling clock is used in the multi-phase sampler 29. Instead of the excluded DFF 13, the DFF 29h having a second clock signal with a phase difference of 180 degrees with respect to the first clock signal as the sampling clock is used in the multi-phase sampler 29.

Figure 9A:
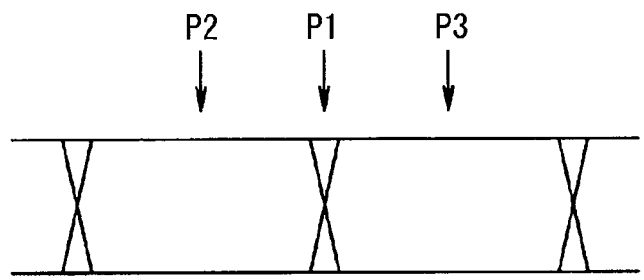
FIG. 9A is a diagram illustrating a timing of data sampling of the phase comparator.
Figure 9B:
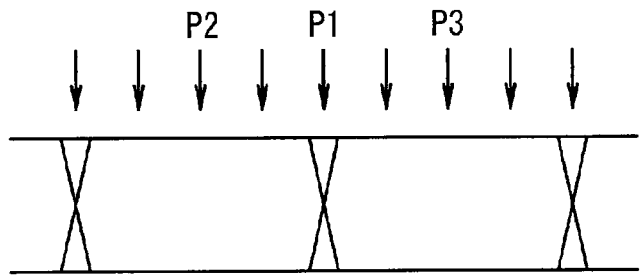
FIG. 9B is a diagram illustrating a timing of data sampling of a multi-phase sampler.
Figure 10:
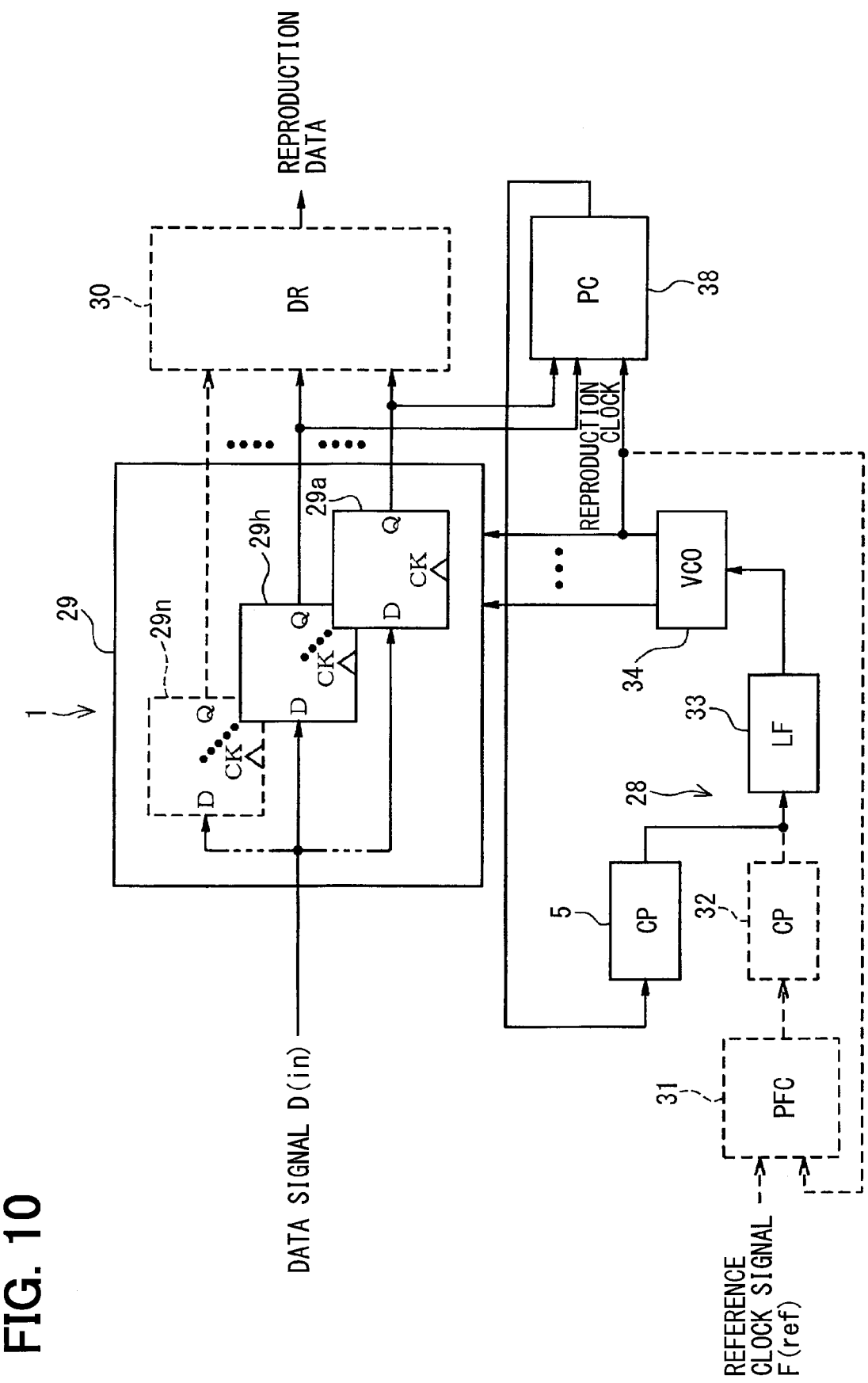
FIG. 10 is a diagram illustrating a circuit that functions in a first operating mode of a PLL system.
Figure 11:
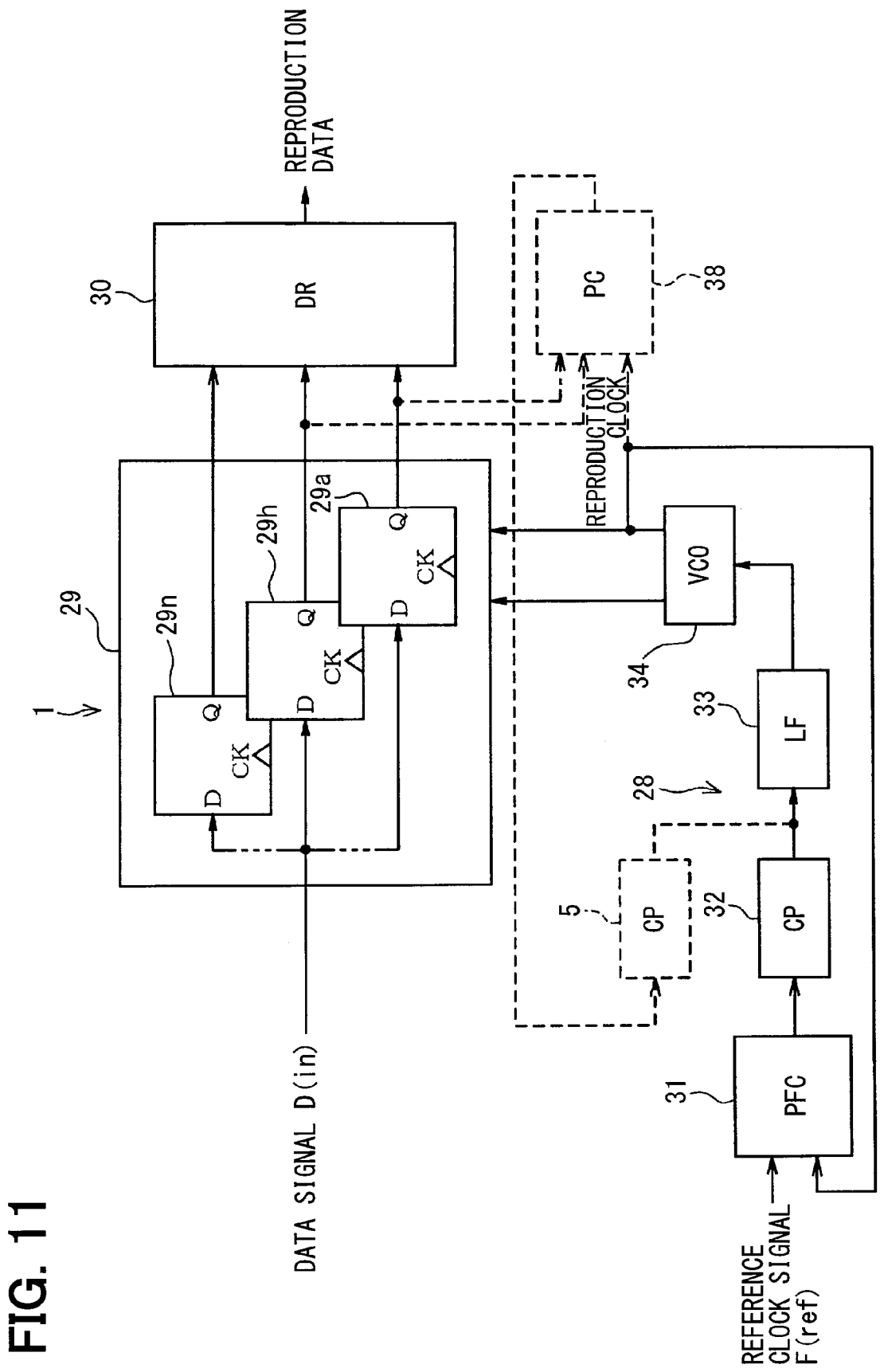
FIG. 11 is a diagram illustrating a circuit that functions in a second operating mode of an oversampling system.

FIG. 9A represents timing of the data sampling of the phase comparator 4B of Alexander. Sampling is performed at a bit end position P1, a bit center position P2 that precedes the bit end position P1 by ½ cycles, and a bit center position P3 that follows the bit end position P1 by ½ cycles as indicated by arrows. On the contrary, FIG. 9B illustrates timing of data sampling of the multi-phase sampler 29 in 4 times oversampling. The sampling is performed at 4 equal divided timing of one cycle as indicated by the arrows. The timing includes the bit end position P1, and the bit center positions P2, P3 that precede and follow the bit end position P1 by ½ cycles. From the above viewpoint, it is understood that some DFFs (DFFs 29a, 29h) of the multi-phase sampler 29 can be shared as the DFFs 12 and 13 of the phase comparator 38.

When the CDR circuit 1 is used as the PLL system, the mode switches to the first operating mode. In this situation, the operation of at least the charge pump circuit 32 stops, and the output line 19 is set to a high impedance. As a result, an output interference of the charge pump circuits 5 and 32 can be prevented. Also, in order to reduce a current consumption, the operation of the phase frequency comparator 31, the multi-phase sampler 29 (except for DFFs 29a and 29h), and/or the data reproducing unit 30 may stop. As a result, as indicated by solid lines in FIG. 10, a phase tracking loop including the phase comparator 38, the charge pump circuit 5, the loop filter 33, and the voltage controlled oscillator 34 is formed to reproduce the clock and data.

When the phase comparator of Hogge is used, the output data of the DFF 29a becomes reproduction data, and when the phase comparator of Alexander is used, the output data of the DFF 29a or DFF 29h becomes reproduction data. The PLL system has a feature that a precision of the clock to be reproduced is high although a time required for locking is long.

When the CDR circuit 1 is used as the oversampling system, the mode switches to the second operating mode. In this situation, the operation of at least the charge pump circuit 5 stops, and the output line 19 is set to the high impedance. As a result, an output interference of the charge pump circuits 5 and 32 can be prevented. Also, in order to reduce the current consumption, the operation of the phase comparator 38 may stop. As a result, as indicated by a solid line in FIG. 11, the multi-phase clock signals are generated by the frequency tracking loop 28. The multi-phase sampler 29 samples the data signal with the multi-phase clock signals, and the data reproducing unit 30 reproduces data with the use of the sample data. The oversampling system has a feature that the time required for locking is short although the precision of clock is low due to a frequency error of the reference clock signal F(ref).

As described above, since the CDR circuit 1 configured as the circuit macro switches between the PLL system and the oversampling system having different characteristics from each other, one LSI can be used for plural intended purposes. The CDR circuit 1 includes a circuit portion shared by the CDR circuits 2 and 3, that is, a configuration in which the voltage controlled oscillator, the loop filter, and the DFF are shared by the CDR circuits 2 and 3. In a real circuit, the layout sizes of the voltage controlled oscillator and the loop filter in circuit elements configuring the CDR circuit are particularly large. On the contrary, the layout sizes of the charge pump circuits 5 and 32 are sufficiently small. Therefore, according to the CDR circuit 1, as compared with a case in which the CDR circuits 2 and 3 of the two systems are mounted, independently, an increase in the layout size of the LSI can be remarkably suppressed.

Second Embodiment

Hereinafter, a second embodiment will be described with reference to FIGS. 12 to 17. A CDR circuit 41 illustrated in FIG. 2 is a reception circuit that reproduces a clock and data from a data signal D(in) serially transmitted, which is a circuit macro formed on an LSI. The CDR circuit 41 has the functions of the CDR circuit 2 of the PLL system illustrated in FIG. 2, and the gated oscillator based CDR, that is, a CDR circuit 42 of a gated oscillator system illustrated in FIG. 13 together, and can switch between both of those systems.

The CDR circuit 42 of the gated oscillator system includes a frequency tracking loop 43, an edge detector 44 (ED), a voltage controlled oscillator 45 (VCO), and a sampler 46 (SMPL). The frequency tracking loop 43 includes the phase frequency comparator 31 (refer to FIG. 8), the charge pump circuit 32 (refer to FIG. 6), the loop filter 33 (refer to FIG. 7), and a voltage controlled oscillator 47.

Figure 14:
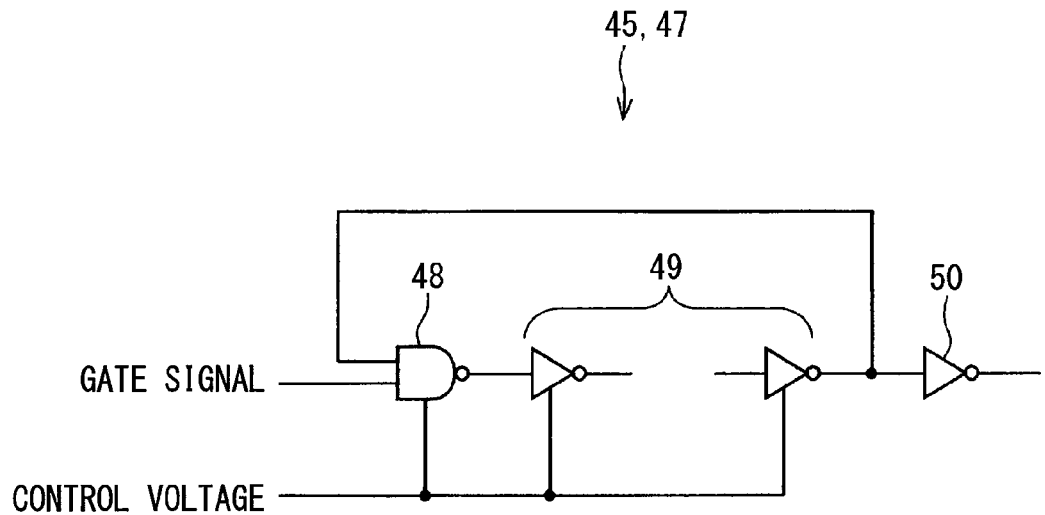
FIG. 14 is a circuit diagram illustrating a voltage controlled oscillator.

The voltage controlled oscillators 45 and 47 having the same configuration each include a NAND gate 48, an inverter group 49 in which an even number of inverters are cascade-connected, and a buffer inverter 50, as illustrated in FIG. 14. The NAND gate 48 and the inverter group 49 form an oscillation loop, and one input terminal of the NAND gate 48 is configured as a gate terminal. An edge detection signal is input to the gate terminal of the voltage controlled oscillator 45 from the edge detector 44. The gate terminal of the voltage controlled oscillator 47 is set to H level (permission level).

Figure 15:
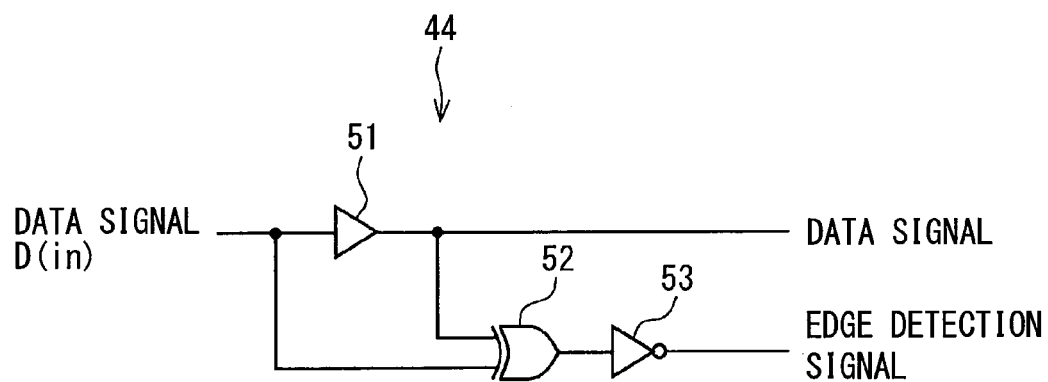
FIG. 15 is a circuit diagram illustrating an edge detector.
Figure 16:
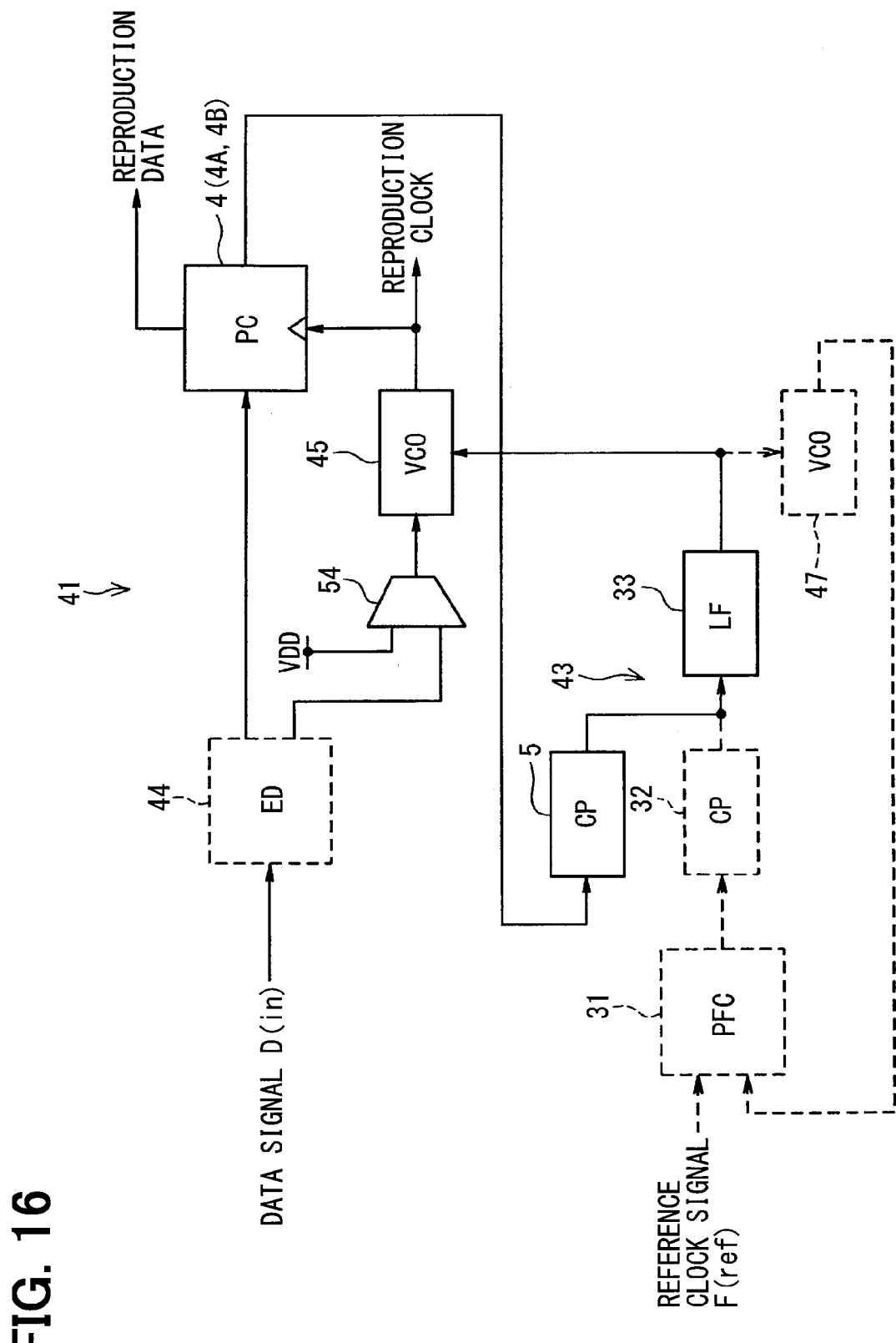
FIG. 16 is a diagram illustrating a circuit that functions in the first operating mode of the PLL system.

The edge detector 44 includes a delay buffer 51, an ExOR 52, and an inverter 53, as illustrated in FIG. 15. When detecting an edge of the data signal D(in), the edge detector 44 outputs an edge detection signal of H level after the signal has become L level once. The sampler 46 includes a DFF that samples the delayed data signal D(in) at a center position of each bit with the reproduction clock output from the voltage controlled oscillator 45.

Figure 12:
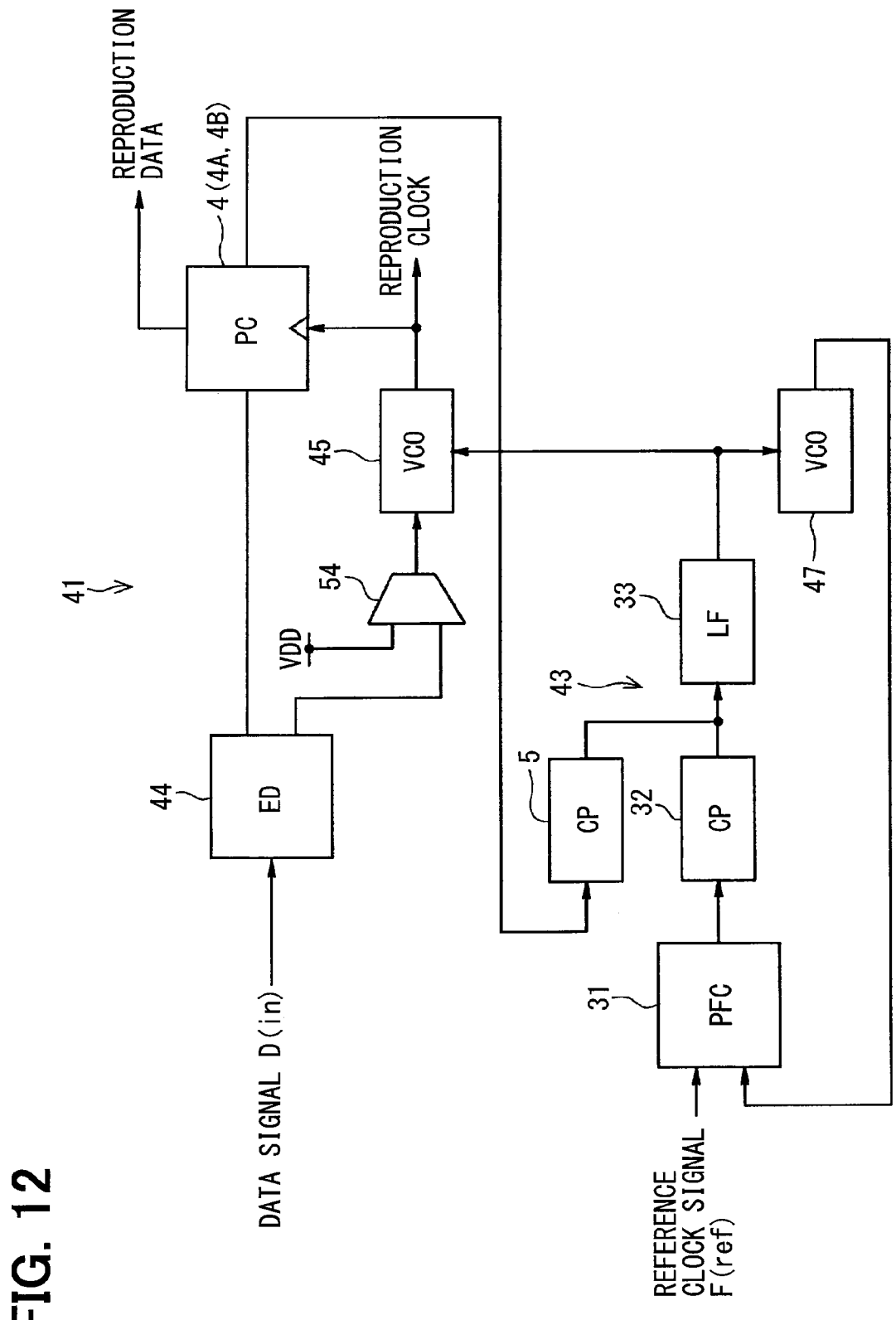
FIG. 12 is a block diagram illustrating a reception circuit according to a second embodiment of the present disclosure.
Figure 13:
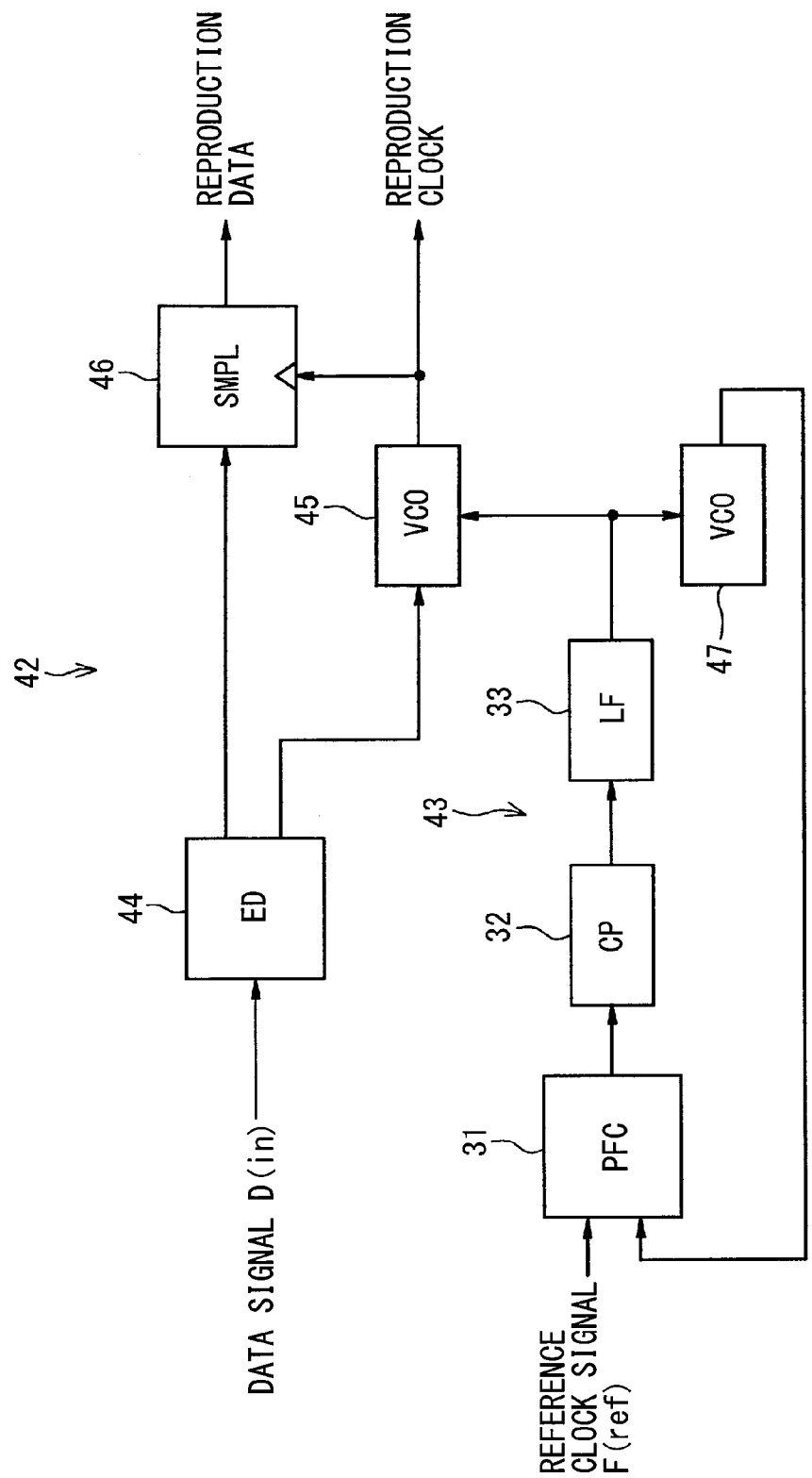
FIG. 13 is a block diagram illustrating a CDR circuit of a gated oscillator system.

The CDR circuit 41 illustrated in FIG. 12 has the functions of the CDR circuits 2 and 42 illustrated in FIGS. 2 and 13. The CDR circuit 41 is not configured to juxtapose the CDR circuits 2 and 42 to each other as it is, but has a configuration in which a circuit portion common to both of those circuits is shared. Specifically, the CDR circuits 2 and 42 share the voltage controlled oscillator 45, the loop filter 33, and the DFFs 8, 12.

The CDR circuit 41 includes the frequency tracking loop 43, the edge detector 44, a selector 54, the voltage controlled oscillator 45, and the phase comparator 4 (4A or 4B). Also, although omitted from the drawing, the CDR circuit 1 has a frequency tracking loop for operating as the CDR circuit of the PLL system. The charge pump circuits 32 and 5 correspond to first and second charge pump circuits, respectively. The voltage controlled oscillator 47 and 45 correspond to first and second voltage controlled oscillators that output the first and second clock signals, respectively.

The selector 54 (corresponding to a first selector) outputs a supply voltage VDD to the gate terminal of the voltage controlled oscillator 45 in the first operating mode described later, and outputs an edge detection signal from the edge detector 44 to the gate terminal in the second operating mode.

The phase comparator 4 is a phase comparator 4A of Hogge illustrated in FIG. 4, or a phase comparator 4B of Alexander illustrated in FIG. 5. As described above, the sampler 46 includes one DFF that samples the bit center position of the data signal with the reproduction clock (second clock signal). On the other hand, the phase comparators 4A and 4B also include the DFFs 8 and 12 that sample the bit center position of the data signal with the reproduction clock, respectively. Therefore, the phase comparator 4 (4A, 4B) includes a function of the sampler 46, and can use the DFFs 8 and 12 as an alternative to the sampler 46. In the phase comparators 4A and 4B, a clock signal having a phase difference of 180 degrees with respect to the second clock signal corresponds to the third clock signal.

When the CDR circuit 41 is used as the PLL system, the mode switches to the first operating mode. In this situation, the selector 54 selects a supply voltage VDD, and the voltage controlled oscillator 45 continuously performs the oscillation operation. Also, the operation of at least the charge pump circuit 32 stops, and the output line 19 is set to the high impedance. As a result, an output interference of the charge pump circuits 5 and 32 can be prevented. Further, in order to reduce the current consumption, the operation of the phase frequency comparator 31, the voltage controlled oscillator 47, and/or the edge detector 44 may stop. As a result, as indicated by solid lines in FIG. 16, a phase tracking loop including the phase comparator 4 (4A, 4B), the charge pump circuit 5, the loop filter 33, and the voltage controlled oscillator 45 is formed to reproduce the clock and data as described in the first embodiment.

When the CDR circuit 1 is used as the gated oscillator system, the mode switches to the second operating mode. In this situation, the selector 54 selects the edge detection signal. Also, the operation of at least the charge pump circuit 5 stops, and the output line 19 is set to the high impedance. As a result, an output interference of the charge pump circuits 5 and 32 can be prevented.

Figure 17:
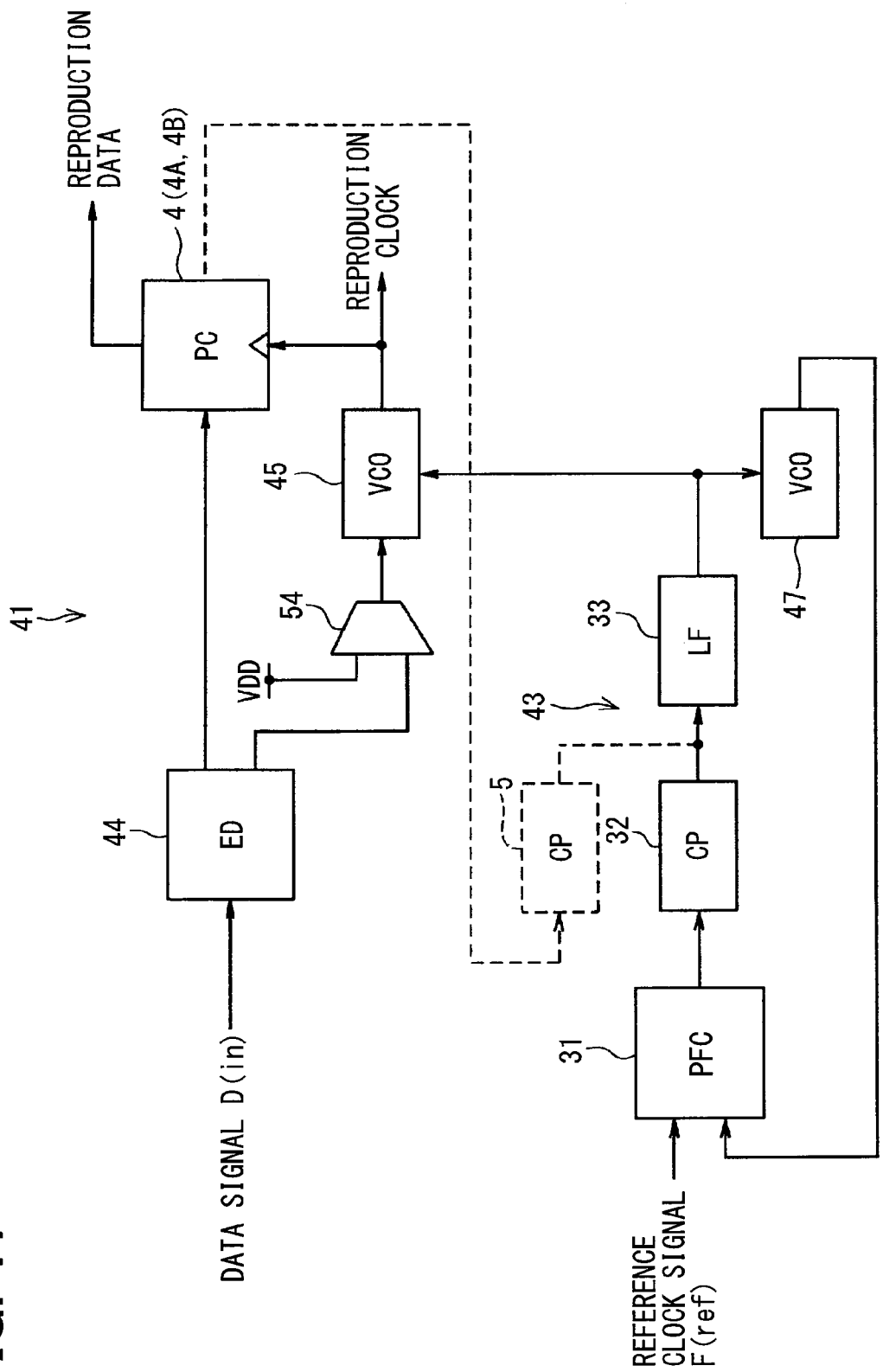
FIG. 17 is a diagram illustrating a circuit that functions in a second operating mode of the gated oscillator system.

As a result, as indicated by a solid line in FIG. 17, the frequency tracking loop 43 generates a control signal for locking the oscillation frequency to the frequency of the reference clock signal F(ref), and supplies the control signal to the voltage controlled oscillator 45. The voltage controlled oscillator 45 performs the oscillation operation in synchronization with the data transition to reproduce the clock. The DFF 8 of the phase comparator 4A or the DFF 12 of the phase comparator 4B samples data instead of the sampler 46, and reproduces the data. The gated oscillator system has a feature that the time required for locking is short although the precision of clock is low due to a frequency error of the reference clock signal F(ref).

As described above, since the CDR circuit 41 configured as the circuit macro switches between the PLL system and the gated oscillator system having different characteristics from each other, one LSI can be used for plural intended purposes. Also, the CDR circuit 41 includes a circuit portion shared by the CDR circuits 2 and 42, that is, a configuration in which the voltage controlled oscillator, the loop filter, and the DFF are shared by the CDR circuits 2 and 42. Therefore, according to the CDR circuit 41, as compared with a case in which the CDR circuits 2 and 42 of the two systems are mounted, independently, an increase in the layout size of the LSI can be remarkably suppressed.

Third Embodiment

Figure 18:
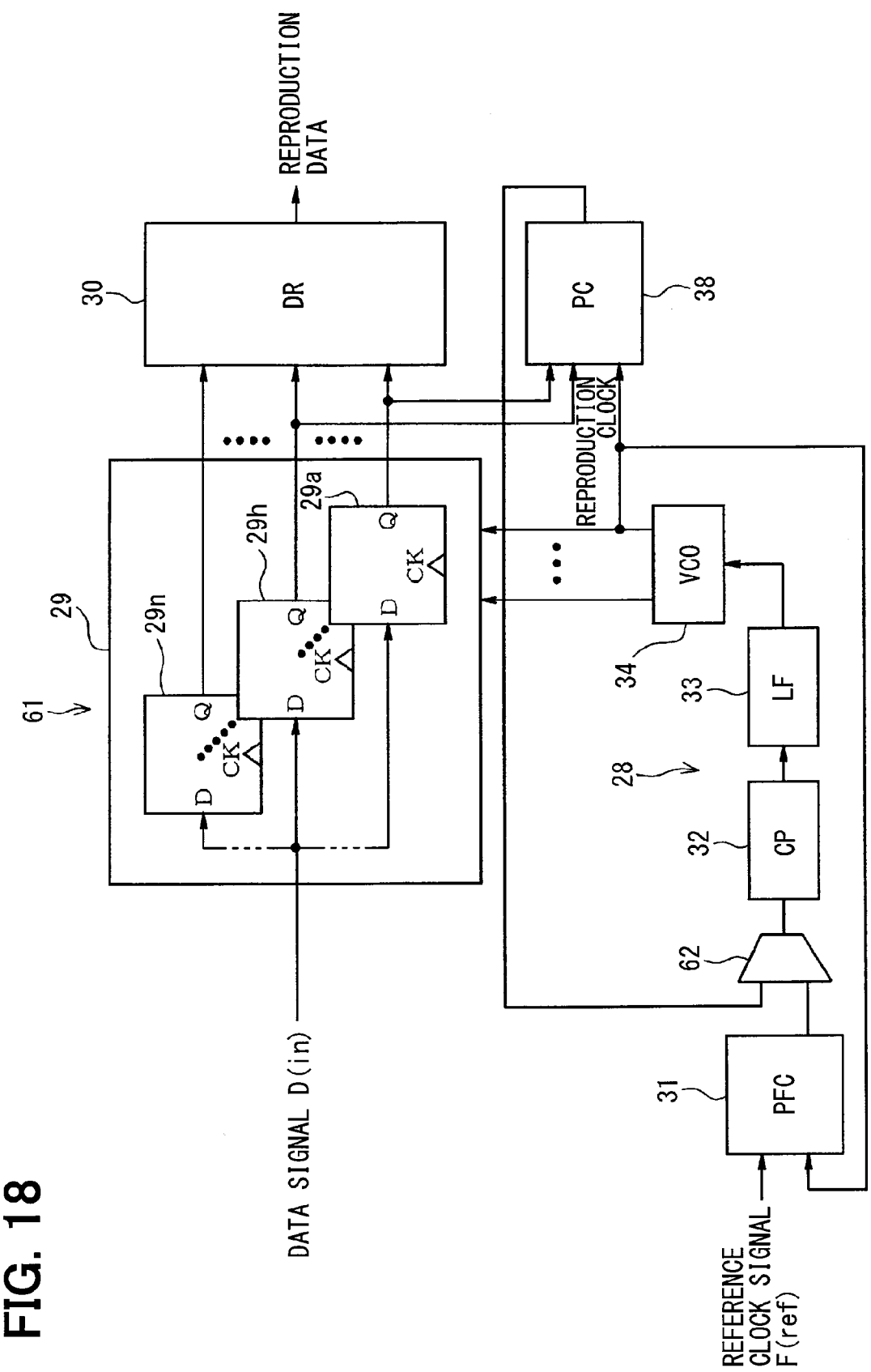
FIG. 18 is a block diagram illustrating a reception circuit according to a third embodiment of the present disclosure.

Hereinafter, a third embodiment will be described with reference to FIG. 18. A CDR circuit 61 according to the present embodiment includes a selector 62 instead of the charge pump circuit 5 of the CDR circuit 1 illustrated in FIG. 1. The selector 62 selects the comparison result of the phase comparator 38, and supplies the comparison result to the charge pump circuit 32 in the first operating mode, and selects the comparison result of the phase frequency comparator 31, and supplies the comparison result to the charge pump circuit 32 in the second operating mode.

In the above configuration, the charge pump circuit 32 always operates. In order to reduce a current consumption, in the first operating mode, the operation of the phase frequency comparator 31, the multi-phase sampler 29 (except for DFFs 29a and 29h), and/or the data reproducing unit 30 may stop. Also, in the second operating mode, the operation of the phase comparator 38 may stop. As a result, the same operation and advantages as those in the first embodiment are obtained.

The charge pump circuit needs precise current control, and noise from a power supply line is likely to be superimposed on the current. When the two charge pump circuits 5 and 32 are provided, because those charge pump circuits 5 and 32 are arranged apart from the power supply line, the flexibility of layout may be lowered. On the contrary, in the present embodiment, since the number of charge pump circuits is reduced to one, the flexibility of layout can be enhanced. Also, since the selector 62 switches a digital signal, the charge pump circuit can be realized with a simple configuration.

Fourth Embodiment

Figure 19:
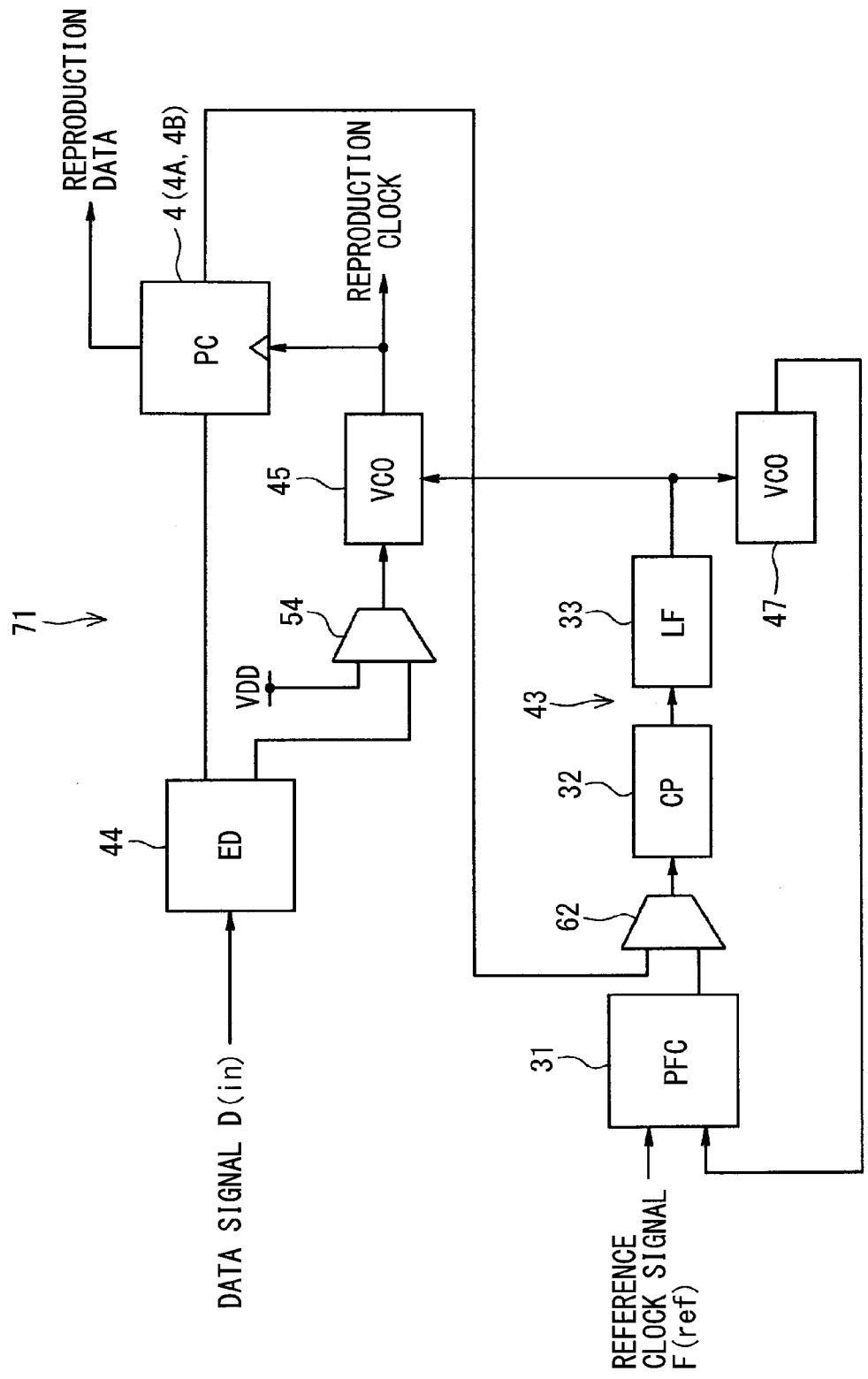
FIG. 19 is a block diagram illustrating a reception circuit according to a fourth embodiment of the present disclosure.

A fourth embodiment will be described with reference to FIG. 19. A CDR circuit 71 according to the present embodiment includes a selector 62 instead of the charge pump circuit 5 of the CDR circuit 41 illustrated in FIG. 12. The selector 62 selects the comparison result of the phase comparator 4, and supplies the comparison result to the charge pump circuit 32 in the first operating mode, and selects the comparison result of the phase frequency comparator 31, and supplies the comparison result to the charge pump circuit 32 in the second operating mode.

In the above configuration, the charge pump circuit 32 always operates. In order to reduce the current consumption, in the first operating mode, the operation of the phase frequency comparator 31, the voltage controlled oscillator 47, and/or the edge detector 44 may stop. According to the present embodiment, the same operation and advantages as those in the second embodiment are obtained, and the flexibility of layout is enhanced as described in the third embodiment.

Fifth Embodiment

Hereinafter, a fifth embodiment will be described with reference to FIG. 20. In the above respective embodiments, the loop filter 33 is shared by the first operating mode and the second operating mode. In both of the operating modes, the cycle of the command signal obtained as a result of comparing the phases with each other may be different from each other. For example, the phase comparators 38 and 4 output the up signal or the down signal every clock cycle, but the phase frequency comparator 31 does not output the up signal and the down signal if the edge timings of the reference clock signal F(ref) and the reproduction clock signal match each other. In this way, if the cycles of the command signals in both of the operating modes are different from each other, optimum constants of the loop filter 33 may be also different from each other.

In a loop filter 81 according to the present embodiment, a resistor 26 is divided into resistors 26a and 26b, and a changeover switch 82 is provided in parallel to one resistor 26b. If the charge pump circuit 32 is replaced with the loop filter 81, the changeover switch 82 switches so that the respective optimum filter constants can be set for the first operating mode and the second operating mode.

Sixth Embodiment

Figure 21:
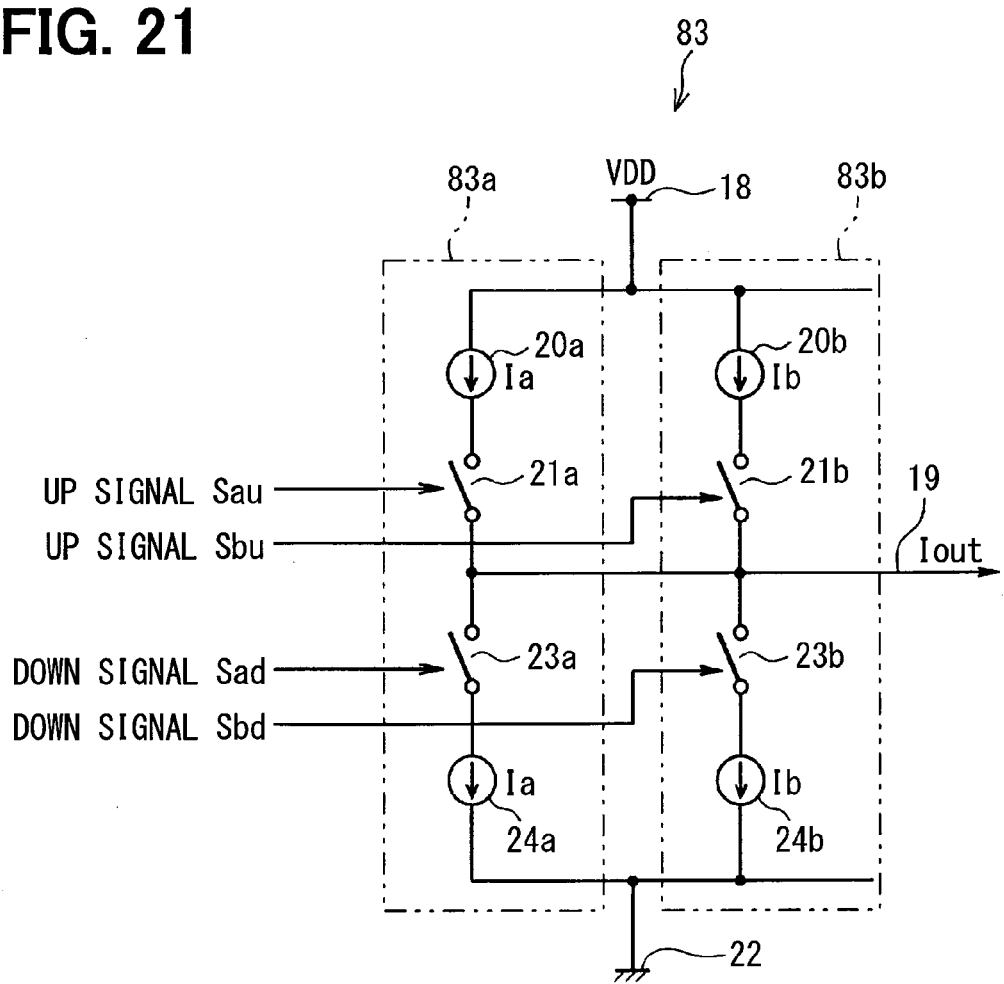
FIG. 21 is a circuit diagram illustrating a charge pump circuit according to a sixth embodiment of the present disclosure.

Hereinafter, a sixth embodiment will be described with reference to FIG. 21. In the above respective embodiments, an optimum current value output by a charge pump circuit may be different between a first operating mode and a second operating mode. In the first and second embodiments in which the charge pump circuit used in each operating mode is different, the output current values of the charge pump circuits 5 and 32 may be optimized. On the contrary, in the third and fourth embodiments, the charge pump circuit 32 is shared in both of the operating modes.

A charge pump circuit 83 according to the present embodiment includes two current output circuits 83a and 83b in parallel. The current output circuit 83a includes constant current circuits 20a, 24a (output current: ±Ia), and semiconductor switches 21a, 23a, and the current output circuit 83b includes constant current circuits 20b, 24b (output current: ±Ib), and semiconductor switches 21b, 23b.

When the charge pump circuit 32 is replaced with the charge pump circuit 83, the optimum current value can be selected from three different current values of Ia, Ib, and Ia+Ib, and output in each of the operating modes. An output line of the circuit not used in the current output circuits 83a and 83b is set as a high impedance. As a result, even if one charge pump circuit 83 is shared by both of the operating modes, the output current value of the charge pump circuit 83 can be optimized in each of those operating modes.

Other Embodiments

The preferred embodiments of the present disclosure have been described above, but the present disclosure is not limited to the above respective embodiments, but can be variously deformed and extended without departing from the spirit of the invention.

When switching between the first and second operating modes, the operation of unnecessary circuit elements stops. The stop of the operation in this case includes various disabling modes for allowing the circuit elements to lose original functions such as the stop of the operation of the individual circuit components, the interruption of the supply voltage, the interruption of the input signal, and the interruption of the output signal.

The circuit configurations of the respective circuit elements illustrated in the figures are merely illustrative. In the above respective embodiments, a D-type flip-flop (DFF) is used as a data sampler, but not limited to this configuration, the data sampler may be configured by a separate sampler circuit as long as it captures the data at the timing of the clock. Also, when the above respective circuits are used for a differential communication, it is preferable to use the sampler of the differential input for the purpose of removing common mode noise. Further, the sampler provided in the phase comparators 4A and 4B, and the plural samplers provided in the multi-phase sampler 29 may be configured by analog circuits instead of the DFFs.

In the first embodiment, the voltage controlled oscillator 34 outputs the multi-phase clock signals of the same number as the number of phases and shifted by an equal phase. In addition, the multi-phase sampler 29 including the samplers 29a to 29n of the same number as the number of phases which perform one sampling per bit according to the respective multi-phase clock signals is used. However, if one sampler can perform plural sampling per bit, the samplers of the same number as the number of phases are not always required.

For example, if a data rate is as low as about 10 Mbps or lower, the number of clock signals is reduced, and a change in the plural phases is superimposed on one clock signal. Simultaneously, the multi-phase sampler is configured by a smaller number (at least one) of samplers, and the respective samplers perform sampling operation with the clock signal at high speed. As a result, the same operation as when the multi-phase sampler 29 is used is obtained.

Specifically, if the data rate is, for example, 10 Mbps in the operating mode of the oversampling system, one multi-phase clock signal of 100 MHz is generated from the reference clock signal F(ref). The multi-phase sampler 29 is replaced with a multi-phase sampler configured by one sampler (DFF). Since a sampling period is 100 MHz, the same effects as those when data of 10 Mbps is oversampled by 10 times are obtained.

When the circuit of Hogge is used in this configuration, the phase comparator 38 has a configuration excluding the DFF 8 from the phase comparator 4A illustrated in FIG. 4. Instead of the excluded DFF 8, the DFF of the multi-phase sampler is used. When the circuit of Alexander is used, the phase comparator 38 has a configuration in which the DFF 12 or 13 is removed from the phase comparator 4B illustrated in FIG. 5. Instead of the excluded DFF 12 or 13, the DFF of the multi-phase sampler is used.

Figure 20:
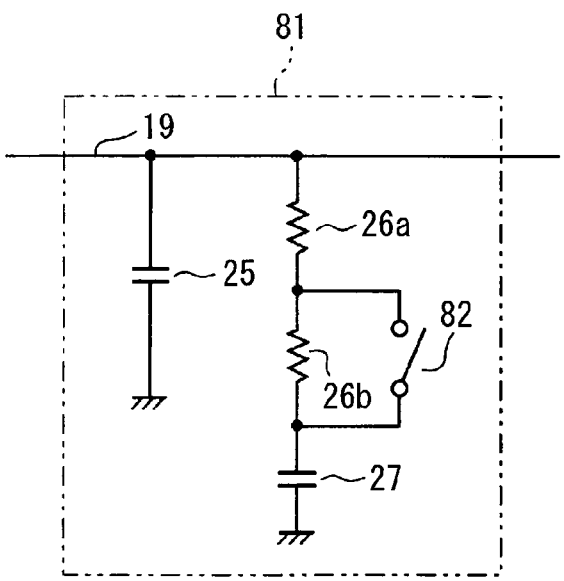
FIG. 20 is a circuit diagram illustrating a loop filter according to a fifth embodiment of the present disclosure.

In the fifth embodiment, the loop filter 81 is not limited to the configuration illustrated in FIG. 20. In general, the loop filter may be configured to include one or plural capacitors and resistors, and the changeover switch 82 that is connected in series with or in parallel to a part of those elements, and turns on/off according to the operating modes. Also, the changeover of the filter constant is not limited to only the resistor, but a constant of the capacitor may switch over.

In the sixth embodiment, the number of parallel connections of the current output circuits may further increase. Also, only one current output circuit may be provided, and the output current values of the constant current circuits 20 and 24 can change.

The CDR circuit that can switch between the PLL system and the oversampling system, and the CDR circuit that can switch between the PLL system and the gated oscillator system have been described. Without being limited to those configurations, the CDR circuit that can switch between the PLL system and the DLL system can be configured in the same manner. The CDR circuit of the DLL system is configured by a phase locked loop and a delay lock loop. The phase locked loop includes the phase frequency comparator PFC, the charge pump circuit CP1, and the loop filter LF1, the voltage controlled oscillator VCO, and a frequency divider. The delay lock loop includes the phase comparator PC, the charge pump circuit CP2, the loop filter LF2, and the voltage controlled delay line VCDL.

In the DLL system, the output voltage of the loop filter LF2 is set to the supply voltage of the voltage controlled delay line VCDL, and the output signal of the voltage controlled oscillator VCO of the phase locked loop is set to the input signal of the voltage controlled delay line VCDL. When the system switches to the PLL system, the phase locked loop is separated from the delay lock loop, and an input and an output of the voltage controlled delay line VCDL are connected to each other to operate as the voltage controlled oscillator VCO. With the above configuration, the CDR circuit can switch between the two circuit systems having characteristics different from each other while suppressing an increase in the layout size when the CDR circuit is mounted on the LSI.

The invention claimed is:
1. A reception circuit comprising:
a frequency tracking loop including a voltage controlled oscillator that outputs multi-phase clock signals having an oscillation frequency corresponding to a control voltage and shifted by equal phase, a phase frequency comparator that compares a phase of a predetermined clock signal of the multi-phase clock signals with a phase of a reference clock signal, a first charge pump circuit that outputs a current corresponding to a comparison result of the phase-frequency comparator, and a loop filter that generates a control voltage applied to the voltage controlled oscillator in response to the current;
a multi-phase sampler having at least one sampler and sampling a transmitted data signal by the multi-phase clock signals;
a data reproducing unit temporarily holding the sample data sampled by the multi-phase sampler and extracting the sample data at a position shifted by a predetermined width from a data boundary position of the data signal;
a phase comparator having a sampler, comparing the phase of the data signal with the phase of a specific clock signal supplied to the specific sampler using output data of the specific sampler among the samplers provided in the multi-phase sampler and output data of a sampler provided in the phase comparator, and reproducing data from the data signal; and a second charge pump circuit outputting a current corresponding to the comparison result of the phase of the phase comparator to the loop filter, when in a first operating mode, the operation of at least the first charge pump circuit of the phase frequency comparator, the first charge pump circuit, the samplers other than the specific sampler provided in the multi-phase sampler, and the data reproducing unit stops, and when in a second operating mode, the operation of at least the second charge pump circuit of the phase comparator and the second charge pump circuit stops.

2. The reception circuit according to claim 1, wherein
the voltage controlled oscillator outputs the multi-phase clock signals of the number equal to the number of phases are each shifted by an equal phase,
the multi-phase sampler includes the samplers of the number equal to the number of phases sampled by the respective multi-phase clock signals,
the specific sampler is a first sampler that sets a first clock signal that is an arbitrary one of the multi-phase clock signals as the specific clock signal, and sets the first clock signal as a sampling clock,
the phase comparator includes:
    a second sampler sampling the output data of the first sampler with a second clock signal that has a phase difference of 180 degrees with respect to the first clock signal, a first logic circuit outputting a command signal for advancing the phase of the first clock signal in a duration when the data signal mismatches the output data of the first sampler, and
    a second logic circuit outputting a command signal for delaying the phase of the first clock signal in a duration when the output of the first sampler mismatches the output data of the second sampler, and
the output data of the first sampler is set as the reproduction data.

3. The reception circuit according to claim 1, wherein
the voltage controlled oscillator outputs the multi-phase clock signals of the number equal to the number of phases each shifted by an equal phase,
the multi-phase sampler includes the samplers of the number equal to the number of phases sampled by the respective multi-phase clock signals,
the specific sampler includes a first sampler that sets a first clock signal that is an arbitrary one of the multi-phase clock signals as the specific clock signal, and sets the first clock signal as a sampling clock, and a second sampler that sets a second clock signal having a phase difference of 180 degrees with respect to the first clock signal among the multi-phase clock signals as a sampling clock,
the phase comparator includes:
    a third sampler sampling the output data of the first sampler with the first clock signal,
    a fourth sampler sampling the output data of the second sampler with the first clock signal,
    a first logic circuit outputting a comparison result that the phase of the first clock signal is advanced if it is detected that the output data of the first sampler mismatches the output data of the fourth sampler, and
    a second logic circuit outputting a comparison result that the phase of the first clock signal is delayed if it is detected that the output data of the third sampler mismatches the output data of the fourth sampler, and
the output data of the first sampler or the third sampler is set as the reproduction data.

4. The reception circuit according to claim 1, wherein
the loop filter is configured for setting different filter constants between the first operating mode and the second operating mode.

5. The reception circuit according to claim 4, wherein
the loop filter includes one or a plurality of capacitors and resistors, and a changeover switch that is connected in series with or in parallel to a part of the one or the plurality of capacitors and resistors, and turns on and off according to the particular operating mode.

6. A reception circuit comprising:
a frequency tracking loop including a first voltage controlled oscillator that outputs a first clock signal having an oscillation frequency corresponding to a control voltage, a phase frequency comparator that compares a phase of the first clock signal with a phase of a reference clock signal, a first charge pump circuit that outputs a current corresponding to a comparison result of the phase-frequency comparator, and a loop filter that generates a control voltage applied to the first voltage controlled oscillator in response to the current;
a second voltage controlled oscillator having a gate terminal, performing oscillation operation having an oscillation frequency corresponding to the control voltage output from the loop filter on the condition that a signal having a permission level is input to the gate terminal, and outputting a second clock signal;
an edge detector outputting an edge detection signal that has the permission level upon detecting an edge of the transmitted data signal;
a selector outputting the signal that has the permission level to the gate terminal in a first operating mode, and outputting an edge detection signal from the edge detector to the gate terminal in a second operating mode;
a phase comparator having a sampler that samples the data signal with the second clock signal, being configured for comparing the phase of the data signal with the phase of the second clock signal, and reproducing data from the data signal; and
a second charge pump circuit outputting a current corresponding to a comparison result of the phases in the phase comparator to the loop filter,
when in the first operating mode, the operation of at least the first charge pump circuit of the phase frequency comparator, the first charge pump circuit, the first voltage controlled oscillator, and the edge detector stops, and when in the second operating mode, the operation of the second charge pump circuit stops.

7. The reception circuit according to claim 6,
wherein the phase comparator includes:
    a first sampler sampling the data signal with the second clock signal;
    a second sampler sampling the output data of the first sampler with a third clock signal that has a phase difference of 180 degrees with respect to the second clock signal;
    a first logic circuit outputting a command signal for advancing the phase of the second clock signal in a duration when the data signal mismatches the output data of the first sampler; and
    a second logic circuit outputting a command signal for delaying the phase of the second clock signal in a duration when the output data of the first sampler mismatch the output data of the second sampler, and
the output data of the first sampler is set as the reproduction data.

8. The reception circuit according to claim 6,
wherein the phase comparator includes:
- a first sampler sampling the data signal with the second clock signal;
- a second sampler sampling the data signal with a third clock signal that has a phase difference of 180 degrees with respect to the second clock signal;
- a third sampler sampling the output data of the first sampler with the second clock signal;
- a fourth sampler sampling the output data of the second sampler with the second clock signal;
- a first logic circuit outputting a comparison result that the phase of the second clock signal is advanced if it is detected that the output data of the first sampler mismatches the output data of the fourth sampler; and
- a second logic circuit outputting a comparison result that the phase of the second clock signal is delayed if it is detected that the output data of the third sampler mismatches the output data of the fourth sampler, and
- the output data of the first sampler or the third sampler is set as the reproduction data.

9. A reception circuit comprising:
- a frequency tracking loop including a voltage controlled oscillator that outputs multi-phase clock signals having an oscillation frequency corresponding to a control voltage and shifted by equal phase, a phase frequency comparator that compares a phase of a predetermined clock signal of the multi-phase clock signals with a phase of a reference clock signal, a charge pump circuit that outputs a current corresponding to a comparison result of the phase-frequency comparator, and a loop filter that generates a control voltage applied to the voltage controlled oscillator in response to the current;
- a multi-phase sampler having at least one sampler, and sampling a transmitted data signal by the multi-phase clock signals;
- a data reproducing unit temporarily holding the sample data sampled by the multi-phase sampler, and extracting the sample data at a position shifted by a predetermined width from a data boundary position of the data signal;
- a phase comparator having a sampler, comparing the phase of the data signal with the phase of a specific clock signal supplied to the specific sampler using output data of the specific sampler among the samplers provided in the multi-phase sampler and output data of a sampler provided in the phase comparator, and reproducing data from the data signal; and
- a selector, configured to select a comparison result of the phase comparator and supply the comparison result to the charge pump circuit when in a first operating mode, and to select a comparison result of the phase frequency comparator and supply the comparison result to the charge pump circuit when in a second operating mode, and
- when in the second operating mode, the charge pump circuit always operates and the operation of the phase comparator stops, and when in the first operating mode, the operation of at least one of the phase frequency comparator, the samplers other than the specific sampler provided in the multi-phase sampler, and the data reproducing unit stops.

10. The reception circuit according to claim 9, wherein the charge pump circuit is configured for outputting different currents between the first operating mode and the second operating mode.

11. The reception circuit according to claim 10, wherein the charge pump circuit includes a plurality of current output circuits connected in parallel to each other and outputting a given current to a direction of a source or a sink through an output line according to an input comparison result, and a current is output from at least a part of the current output circuits according to the particular operating mode.

12. A reception circuit comprising:
- a frequency tracking loop including a first voltage controlled oscillator that outputs a first clock signal having an oscillation frequency corresponding to a control voltage, a phase frequency comparator that compares a phase of the first clock signal with a phase of a reference clock signal, a charge pump circuit that outputs a current corresponding to a comparison result of the phase-frequency comparator, and a loop filter that generates a control voltage applied to the first voltage controlled oscillator in response to the current;
- a second voltage controlled oscillator having a gate terminal, performing oscillation operation that has an oscillation frequency corresponding to the control voltage output from the loop filter on the condition that a signal having a permission level is input to the gate terminal, and outputting a second clock signal;
- an edge detector outputting an edge detection signal having the permission level upon detecting an edge of the transmitted data signal;
- a first selector outputting the signal that has the permission level to the gate terminal in a first operating mode, and outputting an edge detection signal from the edge detector to the gate terminal in a second operating mode;
- a phase comparator having a sampler that samples the data signal with the second clock signal, being configured for comparing the phase of the data signal with the phase of the second clock signal, and reproducing data from the data signal; and
- a second selector selecting a comparison result of the phase comparator and supplying the comparison result to the charge pump circuit when in the first operating mode, and selecting a comparison result of the phase frequency comparator and supplying the comparison result to the charge pump circuit when in the second operating mode, and
- when in the first operating mode, the charge pump circuit always operates, and the operation of at least one of the phase frequency comparator, the first voltage controlled oscillator, and the edge detector stops.

* * * * *